(12) United States Patent
Abiko et al.

(10) Patent No.: US 9,530,838 B2
(45) Date of Patent: Dec. 27, 2016

(54) SEMICONDUCTOR DEVICE AND MANUFACTURING METHOD FOR THE SAME

(71) Applicant: Renesas Electronics Corporation, Koutou-ku, Tokyo (JP)

(72) Inventors: Yuya Abiko, Tokyo (JP); Akio Ichimura, Tokyo (JP); Toshiaki Igarashi, Tokyo (JP); Yasuhiro Shirai, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/826,075

(22) Filed: Aug. 13, 2015

(65) Prior Publication Data

US 2016/0049466 A1    Feb. 18, 2016

(30) Foreign Application Priority Data

Aug. 13, 2014  (JP) .................................. 2014-164951

(51) Int. Cl.
*H01L 29/06* (2006.01)
*H01L 29/66* (2006.01)
(Continued)

(52) U.S. Cl.
CPC ......... *H01L 29/0634* (2013.01); *H01L 29/045* (2013.01); *H01L 29/66666* (2013.01);
(Continued)

(58) Field of Classification Search
CPC ............... H01L 29/0634; H01L 29/402; H01L 29/41766; H01L 29/66727; H01L 29/7811; H01L 29/0638; H01L 29/0696; H01L 29/1095; H01L 29/045; H01L 29/66666; H01L 29/7827
See application file for complete search history.

(56) References Cited

U.S. PATENT DOCUMENTS 7,019,364 B1 *  3/2006  Sato ....................... B82Y 20/00
                                                  257/347
8,106,447 B2 *  1/2012  Hozumi .............. H01L 29/0634
                                                  257/331

(Continued)

OTHER PUBLICATIONS

Extended European Search Report issued Dec. 22, 2015, in European Application No. 15180684.1.

*Primary Examiner* — Nicholas Tobergte
(74) *Attorney, Agent, or Firm* — Shapiro, Gabor and Rosenberger, PLLC

(57) ABSTRACT

To improve characteristics of a semiconductor device (vertical power MOSFET). A spiral p-type column region having a corner is formed in a peripheral region surrounding a cell region in which a semiconductor element is formed. In an epitaxial layer of the peripheral region surrounding the cell region in which the semiconductor element is formed, a trench spirally surrounding the cell region and having the first and second side faces making up the corner is formed and the trench is filled with the epitaxial layer. By spirally arranging the p-type column region (n-type column region) in such a manner, a drop in a withstand voltage margin due to a hot spot can be avoided. In addition, the continuity of the p-type column region (n-type column region) is maintained. As a result, electric field concentration is alleviated step by step toward the outer periphery and the withstand voltage is therefore increased.

20 Claims, 29 Drawing Sheets

(51) Int. Cl.
  *H01L 29/78* (2006.01)
  *H01L 29/04* (2006.01)
  *H01L 29/40* (2006.01)
  *H01L 29/417* (2006.01)
  *H01L 29/10* (2006.01)

(52) U.S. Cl.
  CPC .... *H01L 29/66727* (2013.01); *H01L 29/7811* (2013.01); *H01L 29/7827* (2013.01); *H01L 29/0638* (2013.01); *H01L 29/0696* (2013.01); *H01L 29/1095* (2013.01); *H01L 29/402* (2013.01); *H01L 29/41766* (2013.01)

(56) References Cited

U.S. PATENT DOCUMENTS

| | | |
|---|---|---|
| 2008/0315343 A1 * | 12/2008 | Kitagawa .............. H01L 29/407 257/488 |
| 2010/0230745 A1 | 9/2010 | Saito et al. |
| 2012/0228763 A1 * | 9/2012 | Akiyama ............ H01L 23/5286 257/737 |
| 2012/0273871 A1 | 11/2012 | Yedinak et al. |
| 2013/0149838 A1 | 6/2013 | Saggio et al. |
| 2013/0200499 A1 | 8/2013 | Liaw et al. |
| 2014/0151785 A1 | 6/2014 | Akagi et al. |
| 2016/0204192 A1 * | 7/2016 | Abiko ............... H01L 29/66727 257/341 |

* cited by examiner

SEMICONDUCTOR DEVICE AND MANUFACTURING METHOD FOR THE SAME

CROSS-REFERENCE TO RELATED APPLICATION

The present application claims priority from Japanese Patent Application No. 2014-164951 filed on Aug. 13, 2014, the content of which is hereby incorporated by reference into this application.

TECHNICAL FIELD OF THE INVENTION

The present invention relates to a semiconductor device and a manufacturing method for the same, and relates to, for example, a technique applied preferably to a power semiconductor device and a manufacturing method for the same.

BACKGROUND OF THE INVENTION

In a vertical power MOSFET, which is a power semiconductor device, a super-junction structure has been studied so as to maintain the withstand voltage of the vertical power MOSFET and suppress the on-resistance of the same.

For example, U.S. Patent Application Publication No. 2013-0200499 discloses a semiconductor device having a super-junction structure in its cell region and peripheral region. The peripheral region has a spiral region.

SUMMARY OF THE INVENTION

The inventors have been engaged in research/development of a vertical power MOSFET having a super-junction structure and studying diligently about an improvement in the performance of the vertical power MOSFET. During the course of the study, the inventors have found that in order to enhance the performance of the vertical power MOSFET having the super-junction structure, the structure of the vertical power MOSFET and a manufacturing method for the same should be further improved.

Other problems and novel features will be set forth clearly through the descriptive contents of this specification and drawings attached thereto.

Typical one of embodiments disclosed herein will be outlined briefly as follows.

A semiconductor device according to one embodiment disclosed in the present invention is structured such that a cell region in which a semiconductor element is formed is surrounded by a spiral pillar having a corner.

A manufacturing method for the semiconductor device according to one embodiment disclosed in the present invention includes a step of forming a trench in a semiconductor layer of a first conductive type in a peripheral region surrounding a cell region in which a semiconductor element is formed, the trench spirally surrounding a first region and having a first side face and a second side face that make up a corner, and filling the trench with a semiconductor of a second conductive type.

A semiconductor device according to the following typical embodiments disclosed in the present invention allows an improvement in the characteristics of a semiconductor device.

A manufacturing method for the semiconductor device according to the following typical embodiments disclosed in the present invention allows manufacturing of a semiconductor device with superior characteristics.

BRIEF DESCRIPTIONS OF THE DRAWINGS

DESCRIPTIONS OF THE PREFERRED EMBODIMENTS

Figure 1:
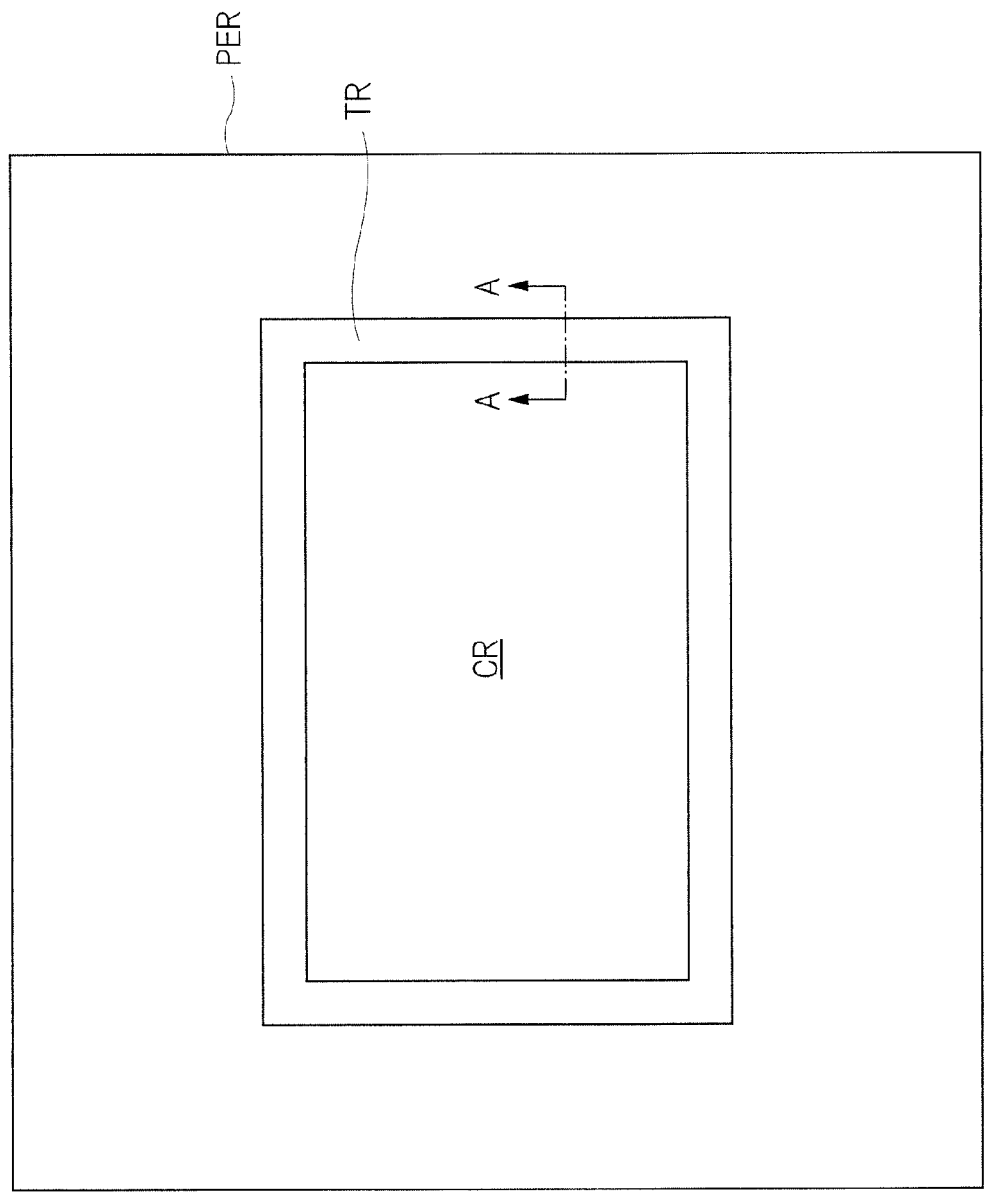
FIG. 1 is a plan view schematically showing a configuration of a semiconductor device (semiconductor chip) according to a first embodiment.

In the following embodiment, when there is the necessity for convenience, the explanation will be divided into plural sections or plural embodiments. However, unless otherwise specified, they are not irrelevant with each other but they have a relationship that one is a modified example, an application, detailed explanation, and supplementary explanation of a part or all of the other. In the following embodiment, when the number of elements, etc. (including the number, a numeric value, quantity, a range, etc.) is referred to, the number of elements may be not restricted to a specific number but may be more than or less than the specific number, except for the case where it is specified in particular or clearly restricted to the specific number in principle.

In the following embodiment, a component (including an element step etc.) referred to is not always essential, except for the case where it is specified in particular or clearly considered to be essential in principle. Similarly, in the following embodiment, when referring to the shape, positional relationship, etc. of a component etc, what is analogous or similar substantially to the shape, positional relationship etc. shall be included, except for the case where it is specified in particular or clearly not considered to be so in principle. The same applies to the number of elements (including the number, a numeric value, quantity, a range, etc.) described above.

Hereinafter, embodiments of the present invention will be explained in detail with reference to the accompanying drawings. In the entire diagrams for explaining the embodiments of the present invention, the same or a related symbol is attached to the member which has the same function, and the repeated explanation thereof is omitted. When plural similar members (regions) exist, an individual or specific region may be indicated by adding a mark to the symbol of a generic name. In the following embodiments, except when necessary in particular, the repeated explanation of the same or a similar part is omitted in principle.

In a drawing employed in the embodiments, even if it is a sectional view, hatching may be omitted in order to make the drawing easier to see. Even if the drawing is a plan view, hatching may be attached on the contrary in order to make the drawing easier to see.

In a sectional view and a plan view, the size of each region does not correctly correspond to an actual device, and a specific region may be displayed relatively larger in order to make the drawing easier to see. Even when a plan view and a sectional view correspond to each other, each region may be displayed in a different size.

First Embodiment

Description of Structure

Figure 2:
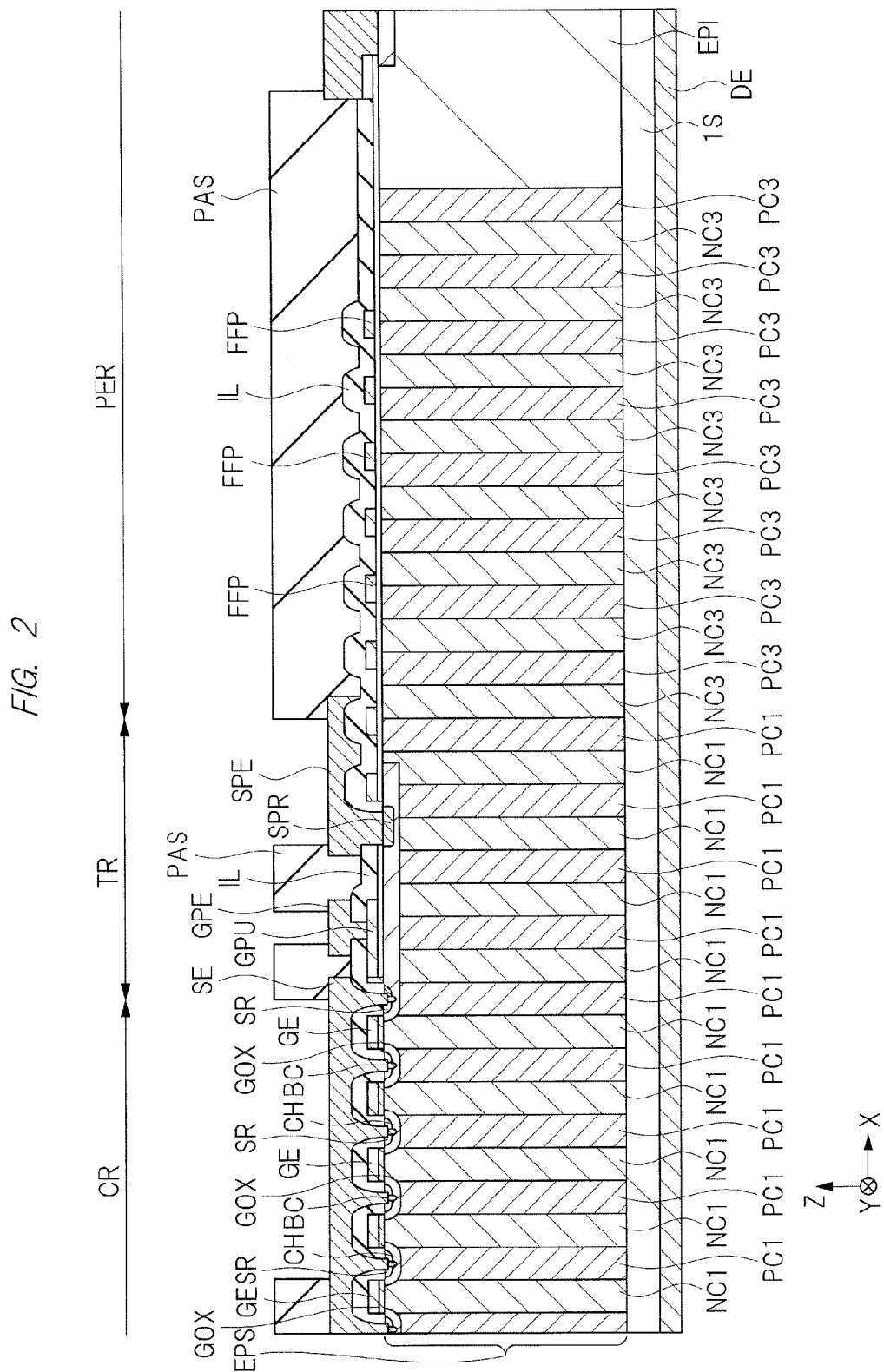
FIG. 2 is a sectional view showing the configuration of the semiconductor device according to the first embodiment.
Figure 3:
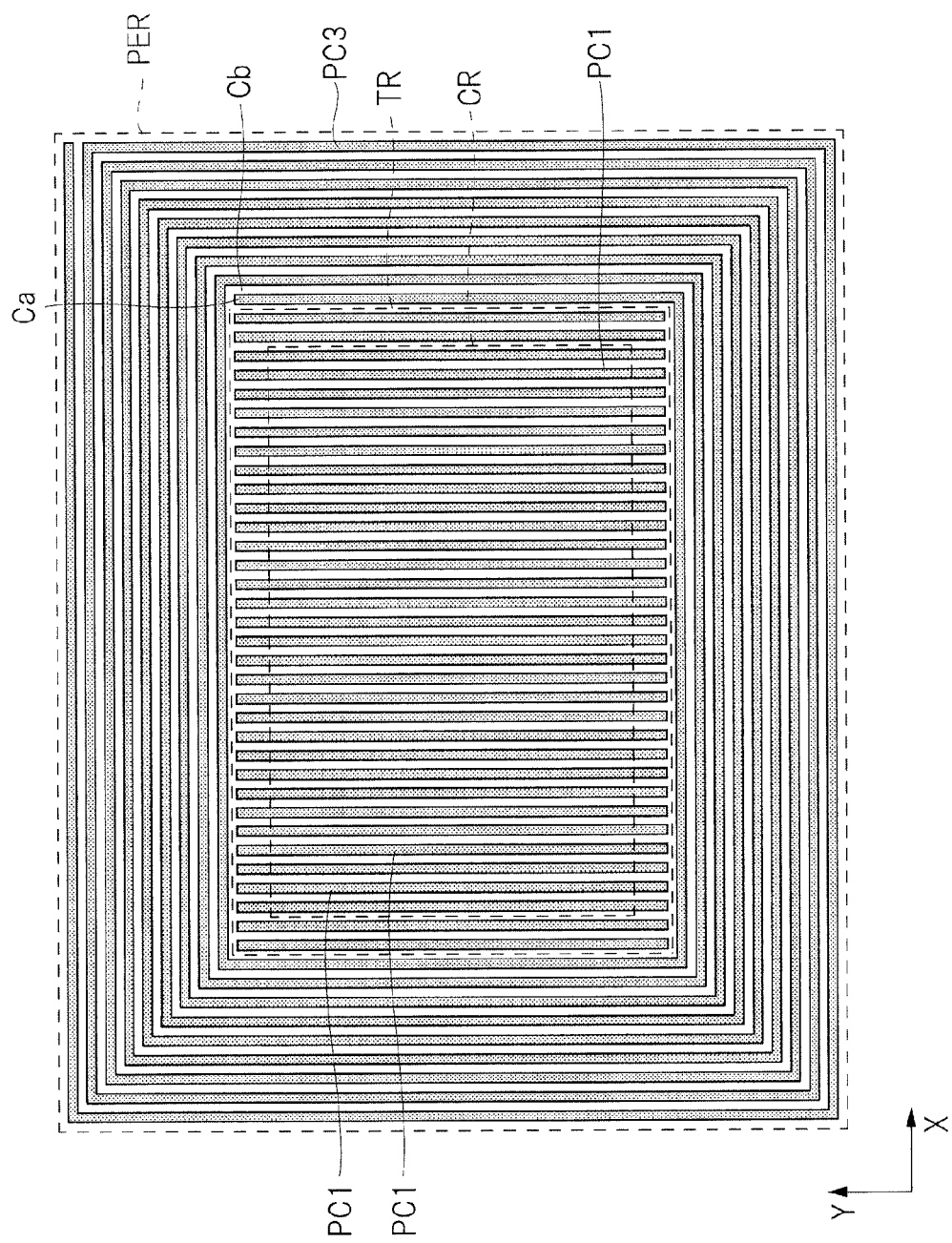
FIG. 3 is a plan view showing a configuration of a p-type column region of the semiconductor device according to the first embodiment.

FIG. 1 is a plan view schematically showing a configuration of a semiconductor device (semiconductor chip) according to a first embodiment. FIG. 2 is a sectional view showing the configuration of the semiconductor device according to the first embodiment. A section shown in FIG. 2, for example, corresponds to an A-A line of FIG. 1. The semiconductor device (semiconductor element) of the first embodiment is a vertical power MOSFET (Metal Oxide Semiconductor Field Effective Transistor). The MOSFET may be referred to as a MISFET (Metal Insulator Semiconductor Field Effect Transistor). FIG. 3 is a plan view showing a configuration of a p-type column region of the semiconductor device according to the first embodiment.

As shown in FIG. 1, the semiconductor device (semiconductor chip) of the first embodiment has a rectangular shape when seen in a plan view from the top. The semiconductor device of the first embodiment includes a cell region CR, an intermediate region TR, and a peripheral region (or termination portion) PER. The cell region CR is located at the center of the almost rectangular semiconductor device, the intermediate region TR is so located as to surround the exterior of the cell region CR, and the peripheral region PER is so located as to surround the intermediate region TR. The configuration of the semiconductor device in each region will hereinafter be described, referring to FIG. 2.

(1) Structure of Cell Region CR

As shown in FIG. 2, a power MOSFET is formed in the cell region CR. This power MOSFET is formed on the main surface of an epitaxial layer EPS on a semiconductor substrate 1S. The epitaxial layer EPS is composed of a plurality of p-type column regions (p-type pillars or pillars) PC1 and a plurality of n-type column regions (n-type pillars or pillars) NC1. The p-type column regions PC1 and the n-type column regions NC1 are arranged alternately in the X direction. Such a structure of which the cyclically arranged p-type column regions PC1 and n-type column regions NC1 are cyclically arranged is referred to as a super-junction structure. As shown in FIG. 3, each p-type column region PC1 has a linear shape (rectangular shape having long sides extending in the Y direction) when seen in a plan view from the top.

For example, the semiconductor device is designed such that the p-type column region PC1 is identical with the n-type column region NC1 in width (dimension in the X direction), length (dimension in the Y direction), and depth (dimension in the Z direction).

Each n-type column region NC1 is, for example, pillar-shaped, and is made of a semiconductor region (epitaxial layer) into which an n-type impurity, such as phosphorus (P) and arsenic (As), is injected. The n-type impurity concentration of the n-type column region NC1 is, for example, $3.0 \times 10^{15}/cm^3$. The n-type column region NC1 and the semiconductor substrate 1S jointly make up a drain region of the power MOSFET. The n-type column region NC1 is sandwiched between two p-type column regions PC1. Hence each pair of n-type column regions NC1 is separated from each other across the width (dimension in the X direction) of each p-type column region PC1.

Each p-type column region PC1 is, for example, pillar-shaped, and is made of a semiconductor region into which a p-type impurity, such as boron (B) is injected. The p-type impurity concentration of the p-type column region PC1 is, for example, $3.0 \times 10^{15}/cm^3$. The p-type column region PC1 is sandwiched between two n-type column regions NC1. Hence each pair of p-type column regions PC1 is separated from each other across the width (dimension in the X direction) of each n-type column region NC1.

The power MOSFET is formed on the main surface of such a structure (epitaxial layer EPS) of which the p-type column regions PC1 and n-type column regions NC1 are cyclically arranged.

The power MOSFET has gate electrodes GE each arranged on the n-type column region NC1 via a gate insulating film GOX. The gate insulating film GOX is provided as, for example, a silicon oxide film. Other than the silicon oxide film, the gate insulating film GOX is provided as, for example, a high-dielectric film, etc. having a dielectric constant higher than that of the silicon oxide film. The gate electrode GE is provided as, for example, a polycrystal silicon film.

Channel regions CH are arranged at an upper part of the p-type column regions PC1 on both sides of the gate electrode GE. A source region SR is arranged such that it is enclosed by each channel CH. The channel region CH is made of a semiconductor region into which a p-type impurity such as boron (B) is injected, and the source region SR is made of a semiconductor region into which an n-type impurity, such as phosphorus (P) and arsenic (As), is injected. As described above, the n-type column region NC1 and the semiconductor substrate 1S jointly make up the drain region of the power MOSFET.

When a voltage is applied to the gate electrode GE of the power MOSFET, carriers (electrons) flow from the source region SR to the drain region (composed of the n-type column region NC1 and semiconductor substrate 1S) via an inversion layer formed in the channel region CH. In other words, current flows from the drain region (composed of the n-type column region NC1 and semiconductor substrate 1S) to the source region SR via the inversion layer formed in the channel region CH.

The gate electrode GE extending in the Y direction, the n-type column region NC1 under the gate electrode GE, and the source regions SR on both sides of the gate electrode GE combine to form a unit cell, and such unit cells are arranged repeatedly. A plurality of unit cells are connected in parallel to form one power MOSFET.

At the center of the source region SR, a body contact region BC is formed so as to extend from an upper surface of the epitaxial layer EPS to the channel region CH. The body contact region BC is made of a semiconductor region into which a p-type impurity such as boron (B) is injected. The impurity concentration of the body contact region BC is higher than that of the channel region CH.

The upper surface and both side faces of the gate electrode GE are covered with an interlayer insulating film IL. The interlayer insulating film IL is provided as, for example, a silicon oxide film. The interlayer insulating film IL extending over the body contact region BC and source region SR on both sides of the body contact region BC is eliminated to form a contact hole therein. On the contact hole and interlayer insulating film IL, a source electrode SE is arranged. The source electrode SE is provided as, for example, a stacked film of a barrier conductive film made of a titanium tungsten film and a main conductive film made of an aluminum film provided in an upper part of the barrier conductive film.

The source electrode SE is thus connected electrically to the source region SR and also to the channel region CH via the body contact region BC. The body contact region BC has a function of ensuring ohmic contact with the source electrode SE. Because of the presence of the body contact region BC, the source region SR and channel region CH are connected electrically at the same potential.

This structure suppresses the on-operation of a parasitic npn bipolar transistor composed of the source region SR functioning as an emitter region, the channel region CH functioning as a base region, and the n-type column region NC1 functioning as a collector region. That is, the source region SR and channel region CH being connected electrically at the same potential means that no potential difference is created between the emitter region and the base region of the parasitic npn bipolar transistor. The on-operation of the parasitic npn bipolar transistor can be, therefore, suppressed.

On the source electrode SE, a surface protective film PAS is arranged such that it partially covers the source electrode SE. The surface protective film PAS is provided as, for example, a silicon oxide film. A part of the source electrode SE is exposed from the surface protective film PAS. A drain electrode DE made of a metal film is arranged on a back surface of the semiconductor substrate 1S (surface opposite to the main surface on which the epitaxial layer ERS is formed).

(2) Structure of Intermediate Region TR

As shown in FIG. 2, a gate pullout unit CPU, a gate pullout electrode GPE, a source pullout region SPR, and a source pullout electrode SPE are formed in the intermediate region TR.

The gate pullout unit GPU and the gate pullout electrode GPE are arranged on the epitaxial layer EPS on the semiconductor substrate 1S. The source pullout region SPR is arranged in the upper part of the epitaxial layer EPS.

In the intermediate region TR, the p-type column regions PC1 and the n-type column regions NC1 are also cyclically arranged. To put it another way, as shown in FIG. 3, in the rectangular region in which the linear p-type column regions PC1 and linear n-type column regions NC1 are alternately arranged, the peripheral area of the cell region CR at the center is defined as the intermediate region TR. Along the sides of the intermediate region TR that extend in the Y direction (left and right sides of the intermediate region TR in FIG. 3), therefore, the linear p-type column regions PC1 and linear n-type column regions NC1 are alternately arranged. Along the sides of the intermediate region TR that extend in the X direction (upper and lower sides of the intermediate region TR in FIG. 3), on the other hand, respective ends of the linear p-type column regions PC1 and linear n-type column regions NC1 extending from the cell region CR into the intermediate region TR are alternately arranged.

In this manner, the structure (epitaxial layer EPS) of which the p-type column regions PC1 and n-type column regions NC1 are cyclically arranged in the intermediate region TR is identical in configuration with the structure (epitaxial layer EPS) of which the p-type column regions PC1 and n-type column regions NC1 are cyclically arranged in the cell region CR.

The gate pullout unit GPU is arranged on the epitaxial layer EPS via the gate insulating film COX. Under the gate pullout unit GPU, the channel region CH is arranged. The upper surface and both side walls of the gate pullout unit GPU are covered with the interlayer insulating film IL, on apart of which an opening is formed such that it exposes a part of the upper surface of the gate pullout unit GPU. The gate pullout unit GPU is provided as, for example, a polycrystal silicon film, as the gate electrode GE is.

The gate pullout electrode GPE is arranged on the interlayer insulating film IL including the opening of the interlayer insulating film IL. The gate pullout electrode GPE is provided as, for example, a stacked film of a barrier conductive film made of a titanium tungsten film and a main conductive film made of an aluminum film provided in an upper part of the barrier conductive film, as in the source electrode SE.

The gate pullout unit GPU is connected electrically to a plurality of gate electrodes GE. A gate voltage applied to the gate pullout electrode GPE is thus supplied to each of the plurality of gate electrodes GE via the gate pullout unit GPU.

In the upper part of the epitaxial layer EPS, the channel region CH is formed so as to extend from the cell region CR. The source pullout region SPR is so arranged that it is enclosed by this channel region CH. The source pullout region SPR is made of a semiconductor region into which an n-type impurity, such as phosphorus (P) and arsenic (As), is injected, as in the source region SR.

The interlayer insulating film IL is arranged on the upper surface of the epitaxial layer EPS such that the interlayer insulating film IL covers the channel region CH. On this interlayer insulating film IL, an opening is formed such that it exposes the source pullout region SPR.

The source pullout electrode SPE is arranged on the interlayer insulating film IL including the opening of the interlayer insulating film IL. The source pullout electrode SPE is provided as, for example, a stacked film of a barrier conductive film made of a titanium tungsten film and a main conductive film made of an aluminum film provided in an upper part of the barrier conductive film, as in the source electrode SE.

In the intermediate region TR, the surface protective film PAS made of silicon oxide is also arranged such that it partially covers the gate pullout electrode GPE and the source pullout electrode SPE. A part of the gate pullout electrode GPE and a part of the source pullout electrode SPE are thus exposed from the surface protective film PAS.

(3) Structure of Peripheral Region PER

As shown in FIG. 2, a field plate electrode (electrode or dummy electrode) FFP is formed in the peripheral region PER.

The field plate electrode FFP is arranged on the epitaxial layer EPS on the semiconductor substrate 1S.

In the peripheral region PER, the p-type column regions PC3 and n-type column regions NC3 are also cyclically arranged. In the peripheral region PER, however, the p-type column region PC3 and n-type column region NC3 of spiral shapes are arranged. These spiral shapes are drawn in a single stroke manner.

As shown in FIG. 3, in the p-type column region PC3, a first loop of the p-type column is arranged so as to surround the intermediate region TR from a corner (starting point) Ca of the rectangular region demarcating the intermediate region TR, and in continuous with the first loop of the p-type column, a second loop of the p-type column is arranged so as to surround the first loop of the p-type column. Further, in continuous with the second loop of the p-type column, a third loop of the p-type column is arranged so as to surround the second loop of the p-type column. In this manner, the n-th loop of the p-type column is arranged so as to surround the (n−1)-th loop of the p-type column. Hence, the intermediate region TR is surrounded by the spirally arranged n loops of p-type columns. FIG. 3 snows the first to ninth loops of the p-type columns (n=9).

The interval between the (n−1)-th loop of the p-type column and the n-th loop of the p-type column is equal, that is, the same given interval. For example, the interval between each pair of p-type columns PC3 corresponds to the width (dimension in the X direction) of the n-type column region NC3. Among the p-type column regions P3, the interval between the (n−1)-th loop of the p-type column and the n-th loop of the p-type column is equivalent to the n-type column region NC3. In the same manner as in the case of the p-type column region P3, therefore, in the n-type column region NC3, by designating a point Cb between the corner Ca and the second loop of the p-type column as the starting point, the first loop of n-type column is arranged along the first loop of the p-type column so as to surround the first loop of the p-type column from the starting point, and in continuous with the first loop of n-type column, the second loop of n-type column is arranged along the second loop of the p-type column so as to surround the second loop of the p-type column. Further, in continuous with the second loop of n-type column, the third loop of n-type column is arranged along the third loop of the p-type column so as to surround the third loop of the p-type column. In this manner, the n-th loop of n-type column is arranged along the n-th loop of the p-type column so as to surround the n-th loop of the p-type column. FIG. 3 shows the first to eight loops of the n-type columns (n=8).

For example, the semiconductor device is designed such that the p-type column region PC3 is identical in width and depth (dimension in the Z direction) with the n-type column region NC3, and such that the p-type column region PC3 and n-type column region NC3 are identical in width (dimension in the X direction) and depth (dimension in the Z direction) with the n-type column region PC1 and n-type column region NC1, respectively.

The n-type column region NC3 has a pillar shape making up a spiral loop, and is made of a semiconductor region (epitaxial layer) into which an n-type impurity, such as phosphorus (P) and arsenic (As), is injected. The n-type impurity concentration of the n-type column region NC3 is, for example, $3.0 \times 10^{15}/cm^3$.

The p-type column region PC3 has a pillar shape making up a spiral loop, and is made of a semiconductor region into which a p-type impurity such as boron (B) is injected. The p-type impurity concentration of the p-type column region PC3 is, for example, $3.0 \times 10^{15}/cm^3$.

In the above manner, even as a structure (epitaxial layer EPS) in which the intermediate region TR is surrounded by the spiral p-type column region PC3 and n-type column region NC3, the p-type column regions PC3 and n-type column regions NC3 are alternately arranged in a cyclical manner in the X and Y directions.

The field plate electrode FFP is formed on the structure (epitaxial layer EPS) in which the peripheral region PER is surrounded by the p-type column region PC3 and n-type column region NC3 of spiral shapes (FIG. 2). The field plate electrode FFP is provided as, for example, a polysilicon film, as in the gate electrode GE. The field plate electrode FFP is covered with the interlayer insulating film IL, which is overlaid with the surface protective film PAS made of silicon oxide. Providing the field plate electrode FFP in this manner can alleviate electric field concentration and increase the withstand voltage.

Figure 28:
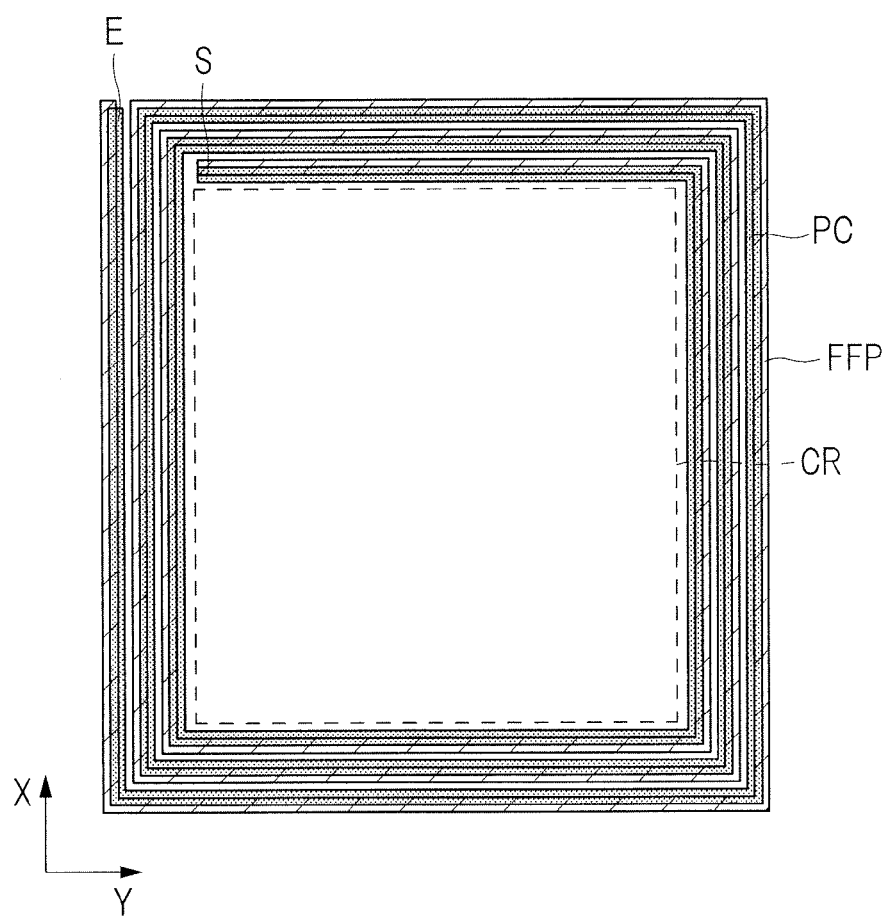
FIG. 28 is a plan view for explaining a configuration of a semiconductor device according to a sixth application example of the second embodiment.

The field plate electrode FFP is arranged, for example, above the boundary between the p-type column region PC3 and the n-type column region NC3, and is spirally arranged as in the p-type column region PC3 and the n-type column region NC3 (see FIG. 28).

The power MOSFET is arranged on the main surface of the above structure (super-junction structure) of which the p-type column regions (PC1) and n-type column regions (NC1) are cyclically arranged. In this configuration, the on-resistance can be reduced while the high withstand voltage is ensured.

For example, when the power MOSFET is arranged on the main surface of the n-type epitaxial layer without adopting the super-junction structure, it is necessary to secure sufficient withstand voltage by lowering the impurity concentration of the epitaxial layer to cause a depletion layer formed in the epitaxial layer to spread.

To realize the high withstand voltage, therefore, a thickness of the epitaxial layer with low impurity concentration must be increased. However, an increase in the thickness of the epitaxial layer with low impurity concentration results in an increase in the on-resistance of the power MOSFET. This means that increasing the power MOSFET's withstand voltage and reducing its on-resistance are trade-off effects that cancel each other out.

When the power MOSFET is arranged on the main surface of the structure (super-junction structure) of which the p-type column regions (PC1) and n-type column regions (NC1) are cyclically arranged, however, the depletion layer spreads laterally from the boundary between the p-type column region (PC1) and the n-type column region (NC1), i.e., from a pn junction extending in the vertical direction (Z direction). As a result, according to the power MOSFET on the super-junction structure, even if the impurity concentration of the n-type column region NC1 serving as a current path is increased so as to reduce the on-resistance, the depletion layer spreading laterally from the pn junction extending in the vertical direction (Z direction) can ensure sufficient withstand voltage.

In this manner, by adopting the structure of which the p-type column regions (PC1) and n-type column regions (NC1) are cyclically arranged, the on-resistance is reduced while the high withstand voltage is ensured.

The p-type column regions (PC1 or PC3) and n-type column regions (NC1 or NC3) are cyclically arranged not only in the cell region CR, but also in the intermediate region TR and in the peripheral region PER. This causes deletion layers to spread so as to surround the cell region CR, so that the withstand voltage can be further increased.

According to this embodiment, in the peripheral region PER, the p-type column region PC3 and the n-type column region NC3 are spirally arranged. This configuration can alleviate electric field concentration and increase the withstand voltage, which will be described later.

Members arranged in the cell region CR, intermediate region TR, and peripheral region PER are not limited to the members described above, and different members may be arranged in those regions. For example, in the peripheral region PER, a guard ring, etc., may be provided in addition to the p-type column region PC3.

[Description of Manufacturing Method]

A manufacturing method for the semiconductor device according to the first embodiment will then be described and the configuration of the semiconductor device according to the first embodiment will be described more clearly, referring to FIGS. 4 to 17. FIGS. 4 to 17 are sectional views or plan views showing manufacturing processes for the semiconductor device according to the first embodiment. The semiconductor device according to the first embodiment is manufactured using a so-called "trench-fill method". According to the semiconductor device of the first embodiment, the withstand voltage of the pn junctions in the cell region CR and intermediate region TR is, for example, about 600 to 650 V, and the withstand voltage of the pn junctions in the peripheral region PER is about 700 to 750 V.

Figure 4:
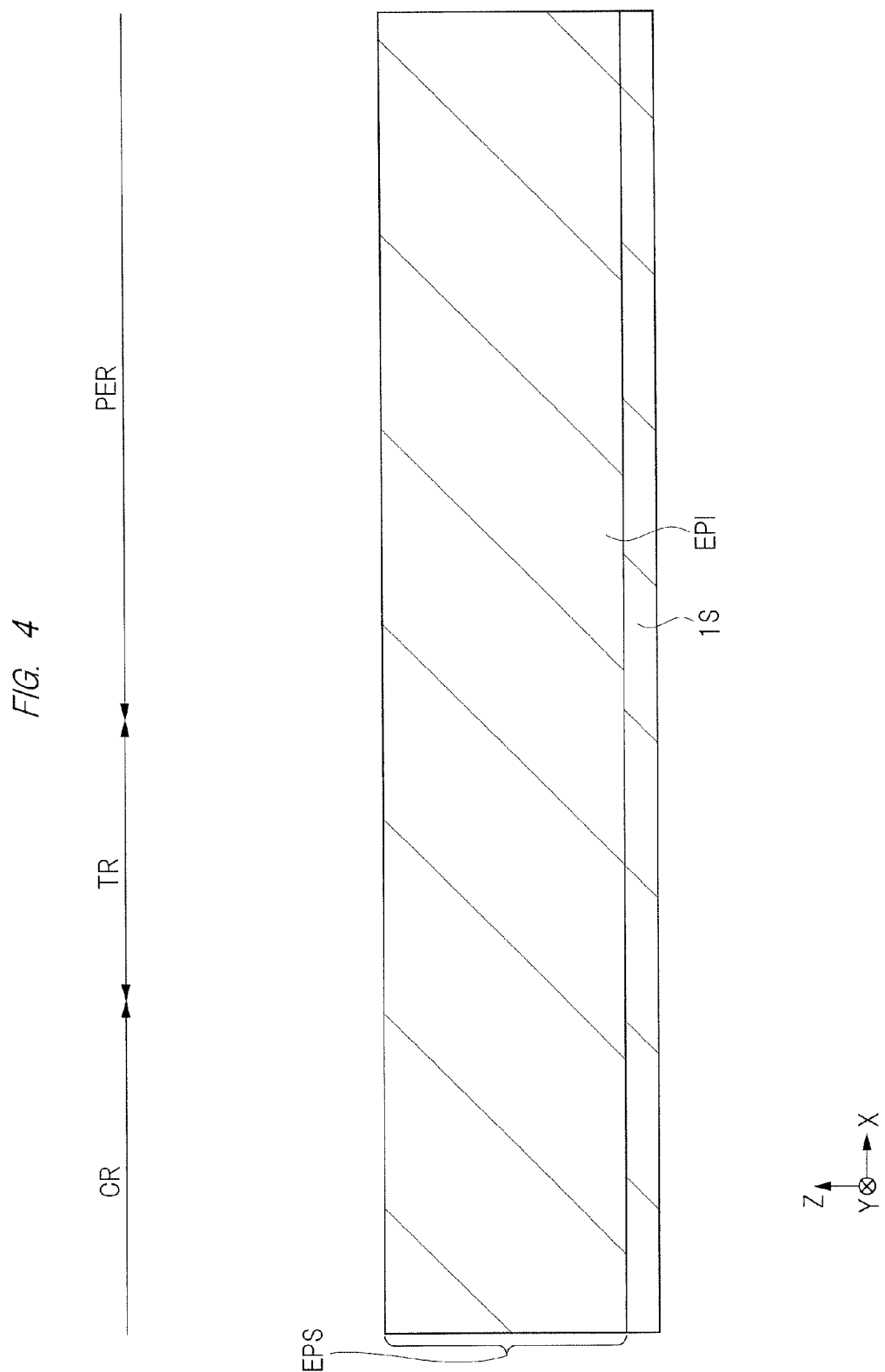
FIG. 4 is a sectional view showing a manufacturing process for the semiconductor device according to the first embodiment.

As shown in FIG. 4, the semiconductor substrate 1S having an epitaxial layer EPI made of an n-type semiconductor layer that is formed on the main surface (surface or upper surface) of the semiconductor substrate 1S is prepared. For example, the semiconductor substrate 1S is formed by injecting an n-type impurity, such as phosphorus (P) and arsenic (As), into single-crystal silicon. The n-type impurity concentration of the epitaxial layer EPI is, for example, about $3.4 \times 10^{15}/cm^3$ and the thickness of the same is, for example, about 40 to 50 μm.

Figure 5:
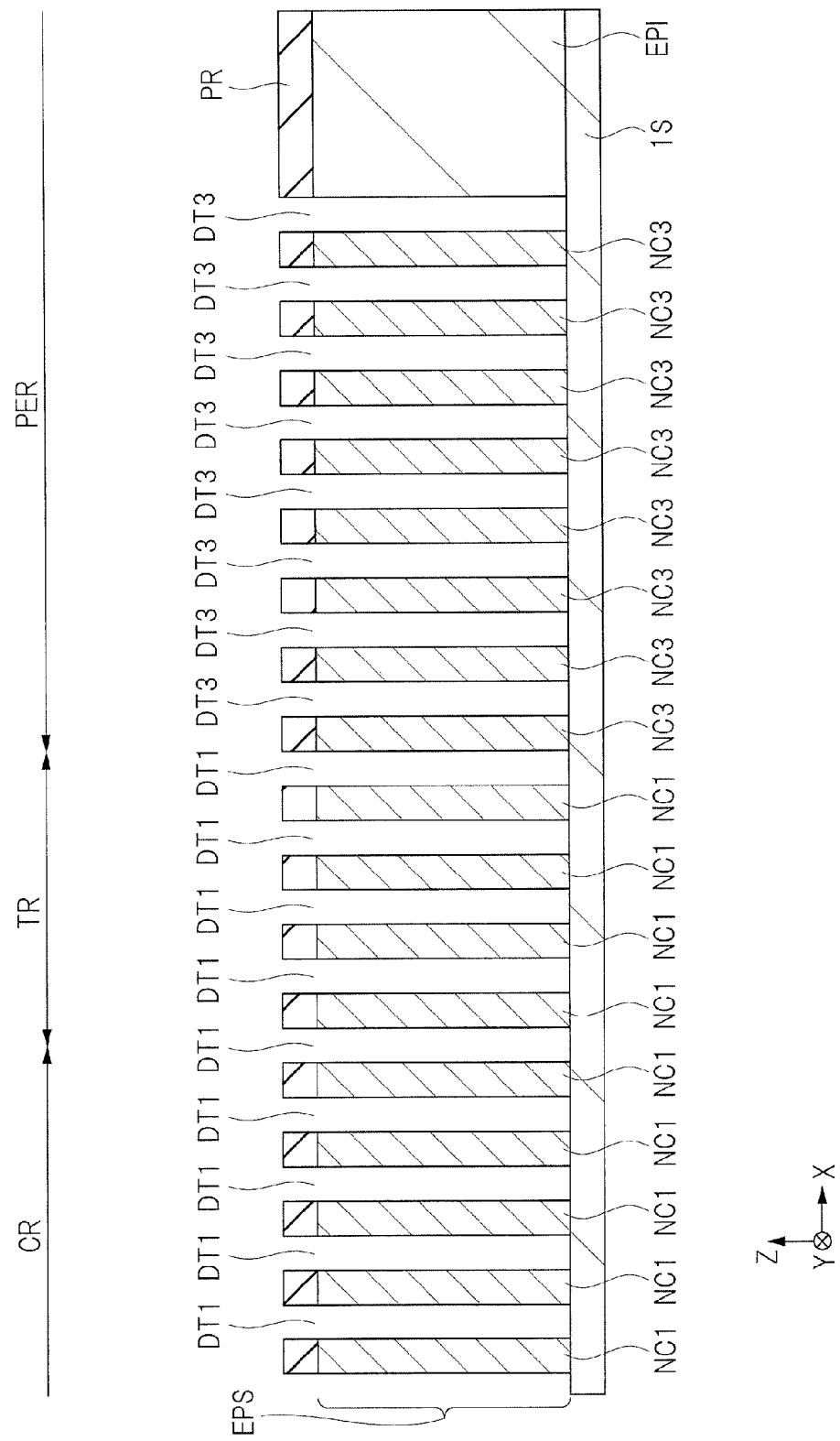
FIG. 5 is a sectional view showing a manufacturing process for the semiconductor device according to the first embodiment, and showing the manufacturing process following the manufacturing process of FIG. 4.

Subsequently, as shown in FIG. 5, a photoresist film PR is formed on the upper surface of the epitaxial layer EPI and is exposed to light and developed. As a result, the photoresist film PR is formed in an area for forming the n-type column region (NC1, NC3) on the epitaxial layer EPI. Specifically, the linear photoresist film PR is formed in the cell region CR and intermediate region TR, while the spiral photoresist film PR is formed in the peripheral region PER. To put it another way, the epitaxial layer EPI in an area for forming the p-type column region (PC1, PC3) is left exposed, which means that linear exposed portions of the epitaxial layer EPI are formed in the cell region CR and intermediate region TR while spiral exposed portions of the epitaxial layer EPI are formed in the peripheral region PER. Light-exposure (reticle transfer) in the cell region CR (including the intermediate region TR) and in peripheral region PER may be performed at once or be performed separately region by region.

Figure 6:
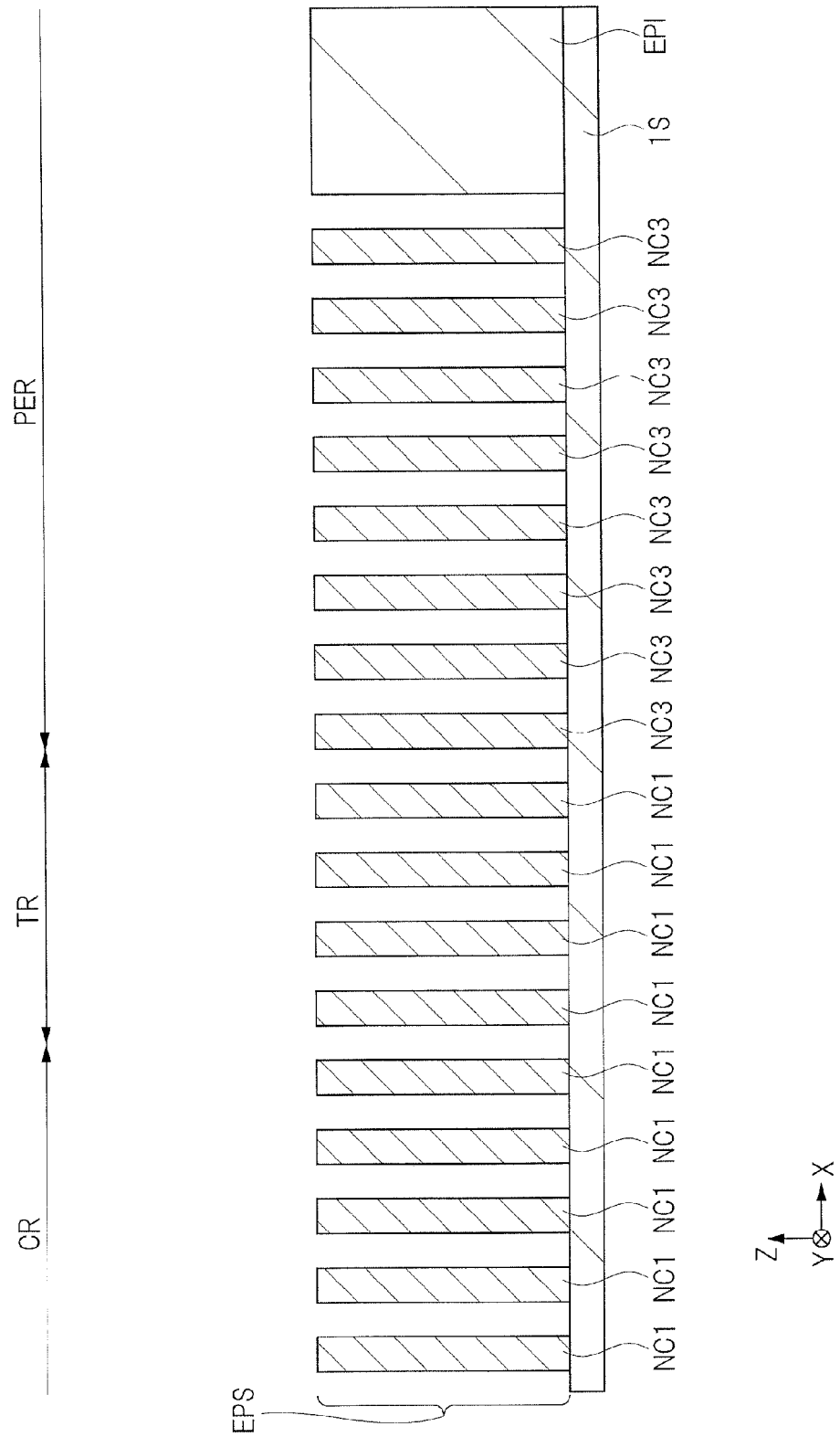
FIG. 6 is a sectional view showing a manufacturing process for the semiconductor device according to the first embodiment, and showing the manufacturing process following the manufacturing process of FIG. 5.

Subsequently, the epitaxial layer EPI is etched using the photoresist film PR as a mask. As a result, the epitaxial layer EPI is eliminated in the area for forming the p-type column region (PC1, PC3), where trenches (DT1, DT3) are formed as a result of the elimination. As shown in FIG. 6, the photoresist film PR is then eliminated by ashing, etc. Such a process of carrying out etching, using a photoresist film or hard mask film processed into a desired pattern through light-exposure and development as a mask, to process a film under the layer into a desired pattern is referred to as patterning.

Figure 7:
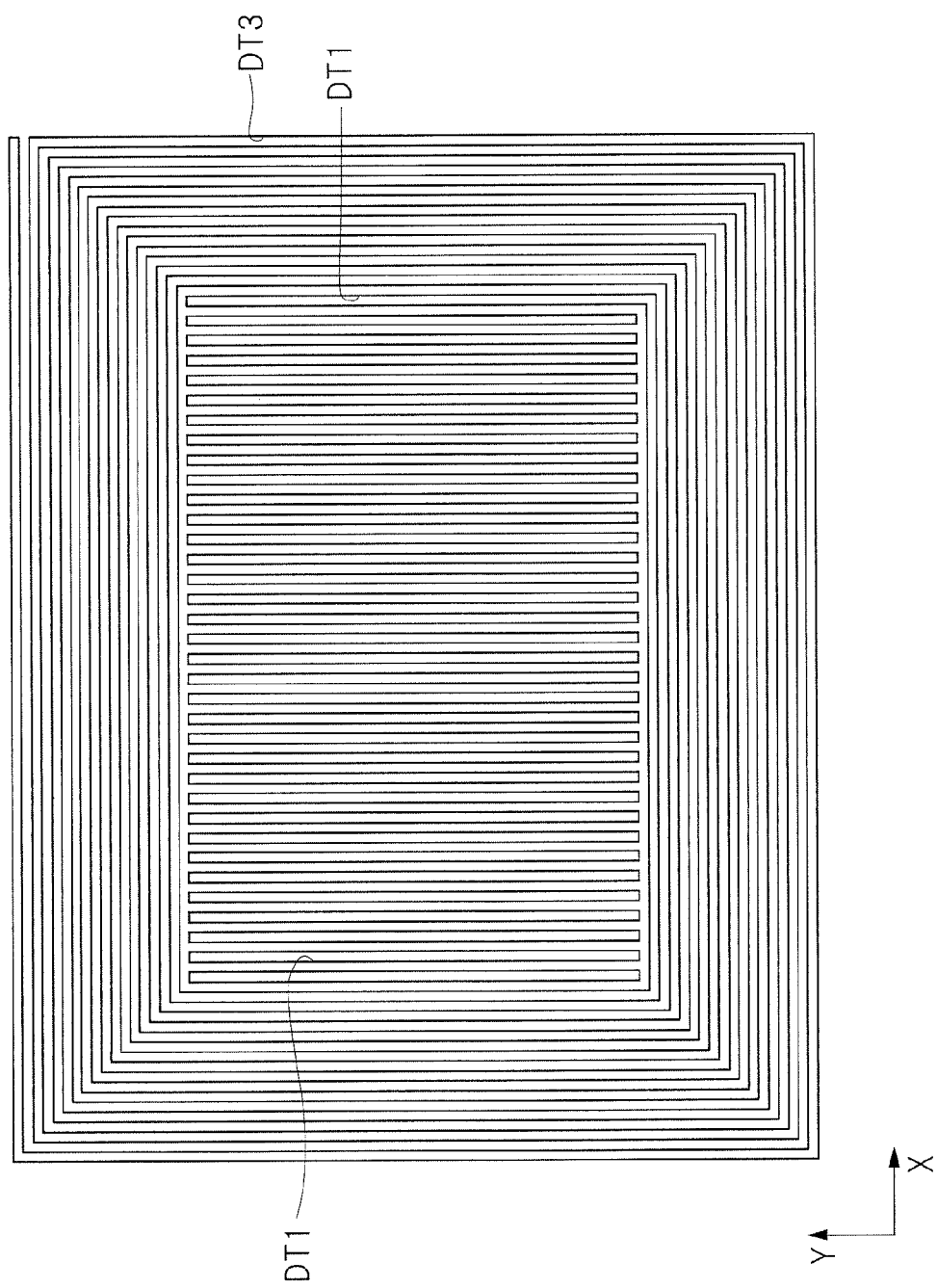
FIG. 7 is a plan view showing a manufacturing process for the semiconductor device according to the first embodiment.

As shown in FIGS. 6 and 7, trenches formed in the epitaxial layer EPI of the cell region CR and the intermediate region TR are denoted as DT1, and trenches formed in the epitaxial layer EPI of the peripheral region PER are denoted as DT3. The trenches DT1 are linear while the trench DT3 is spiral (FIG. 7).

For example, each trench DT1 is about 2 to 5 μm in width (dimension in the X direction) and is about 40 to 60 μm in depth (dimension in the Z direction). The epitaxial layer EPI left as it is between the trenches DT1 makes up the linear n-type column regions NC1. For example, each n-type column region NC1 is about 2 to 5 μm in width (dimension in the X direction) and is about 40 to 60 μm in depth (dimension in the Z direction).

The trench DT3 is about 2 to 5 μm in width and is about 40 to 60 μm in depth (dimension in the Z direction). The epitaxial layer EPI left as it is between the trenches DT3 makes up the spiral n-type column region NC3. For example, the n-type column region NC3 is about 2 to 5 μm in width and is about 40 to 60 μm in depth (dimension in the Z direction).

Figure 8:
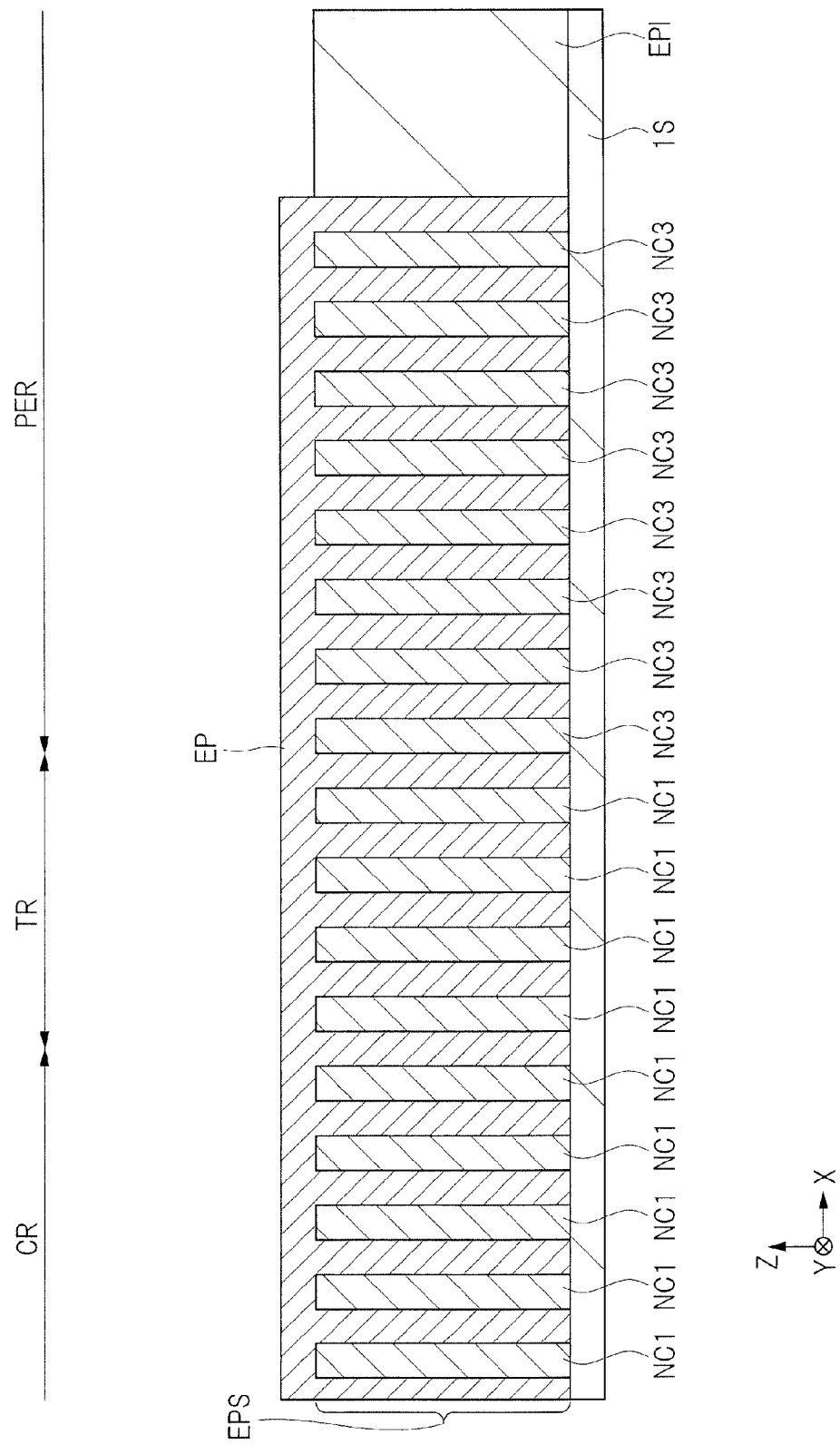
FIG. 8 is a sectional view showing a manufacturing process for the semiconductor device according to the first embodiment, and showing the manufacturing process following the manufacturing process of FIG. 6.

Subsequently, as shown in FIG. 8, a p-type epitaxial layer EP is formed inside the trenches DT1 and DT3 and on the upper surface of the epitaxial layer EPI by the filling epitaxial growth method. Specifically, the epitaxial layer EP is caused to start growing from the bottoms and side walls (side faces) of the trenches DT1 and DT3 and eventually to fill such trenches. During this growth process, the epitaxial layer EP grows in an upper part of the epitaxial layer EPI between the trenches as well as on top of the trenches DT1 and DT3 having been filled with the epitaxial layer EP. Because the trench DT3 is spiral, the epitaxial layer EP grows from side faces extending in the X direction as well as from other side faces extending in the Y direction. In this growth process, because the trench DT3 has a spiral shape with corners, the trench DT3 can be filled with the epitaxial layer EP with high precision, the reasons for which will be described in detail later (see FIGS. 19 and 20).

Figure 9:
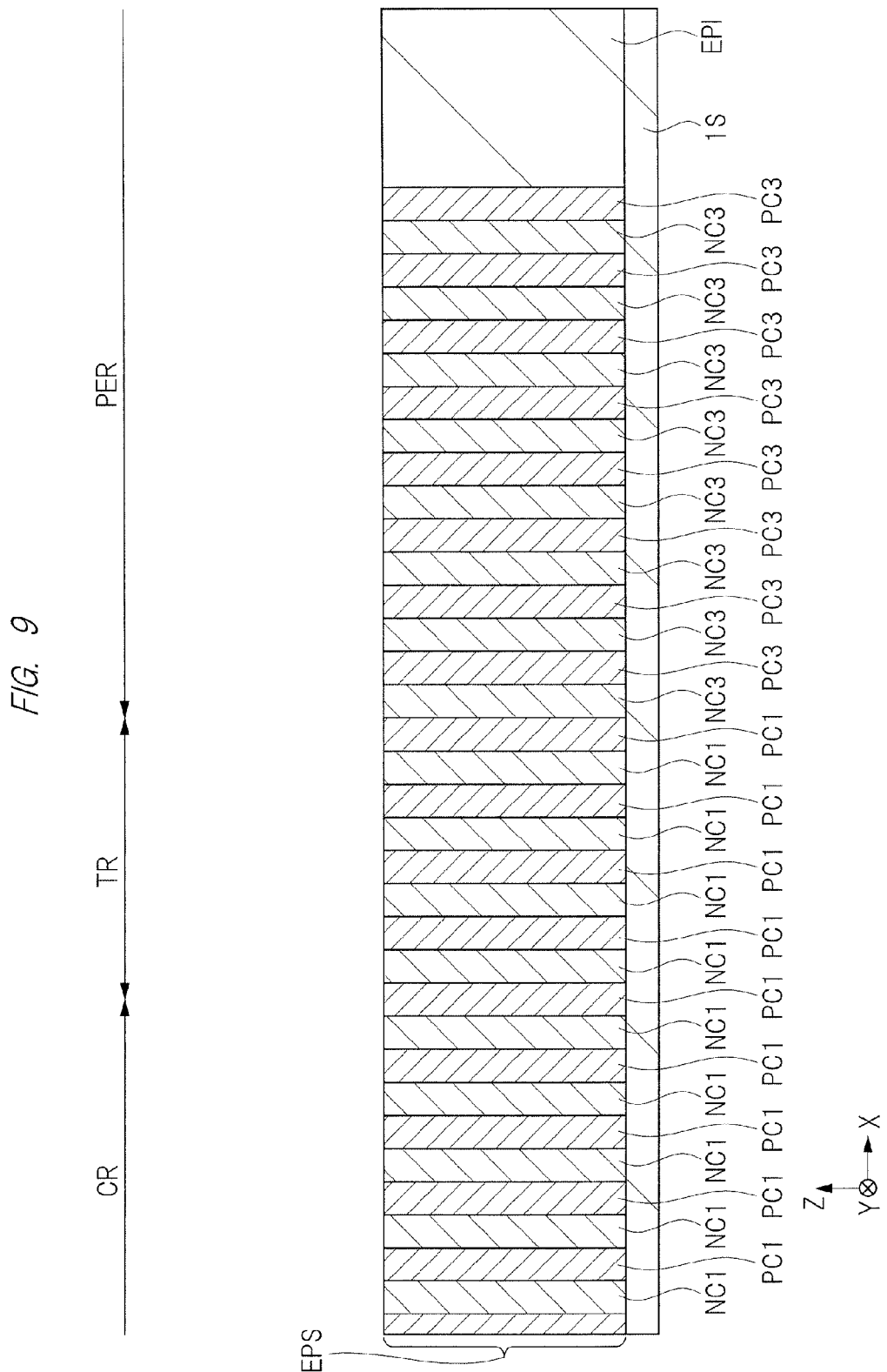
FIG. 9 is a sectional view showing a manufacturing process for the semiconductor device according to the first embodiment, and showing the manufacturing process following the manufacturing process of FIG. 8.

Subsequently, as shown in FIG. 9, the epitaxial layer EP in an upper part of the trenches DT1 and DT3 is eliminated by CMP (Chemical Mechanical Polishing), etc., to fill the trenches DT1 and DT3 completely with the epitaxial layer EP. Hence the linear p-type column regions PC1 and the spiral p-type column region PC3 are formed. To put it another way, the epitaxial layer EPS composed of the plurality of p-type column regions PC1, the p-type column region PC3, the plurality of n-type column regions NC1, and the n-type column region NC3 is formed.

Figure 10:
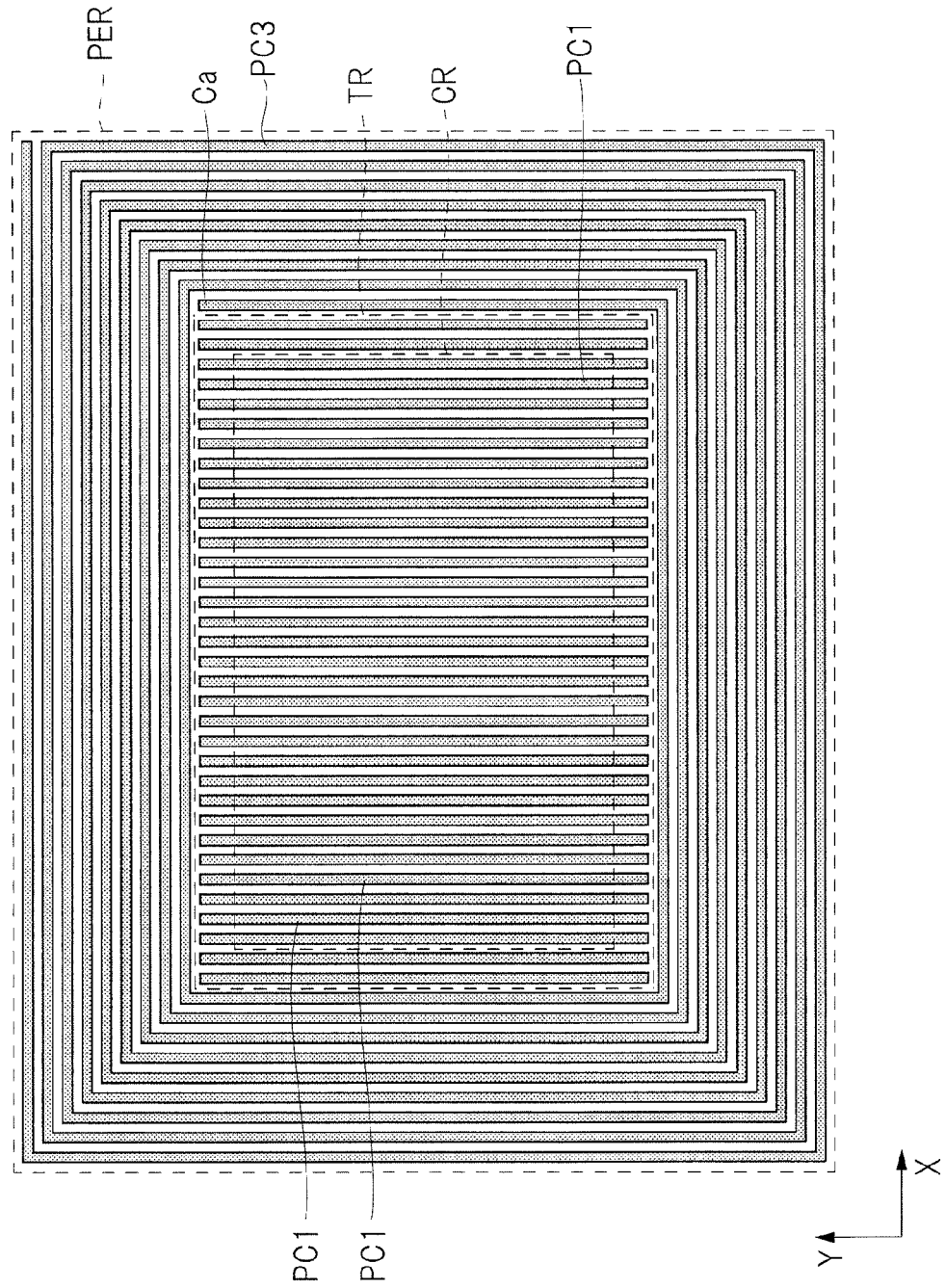
FIG. 10 is a plan view showing a manufacturing process for the semiconductor device according to the first embodiment.

Through the above processes, the structure of which the linear p-type column regions PC1 and n-type column regions NC1 are alternately arranged in the X direction in a cyclical manner is formed in the cell region CR and intermediate region TR, while the structure composed of the spiral p-type column region PC3 and the spiral n-type column region NC3 that surround the intermediate region TR is formed in the peripheral region PER (FIG. 10).

Subsequently, the power MOSFET, the gate pullout unit GPU, the gate pullout electrode GPE, the source pullout region SPR, the source pullout electrode SPE, the field plate electrode FFP, etc., are formed on the main surface of the epitaxial layer EPS.

Figure 11:
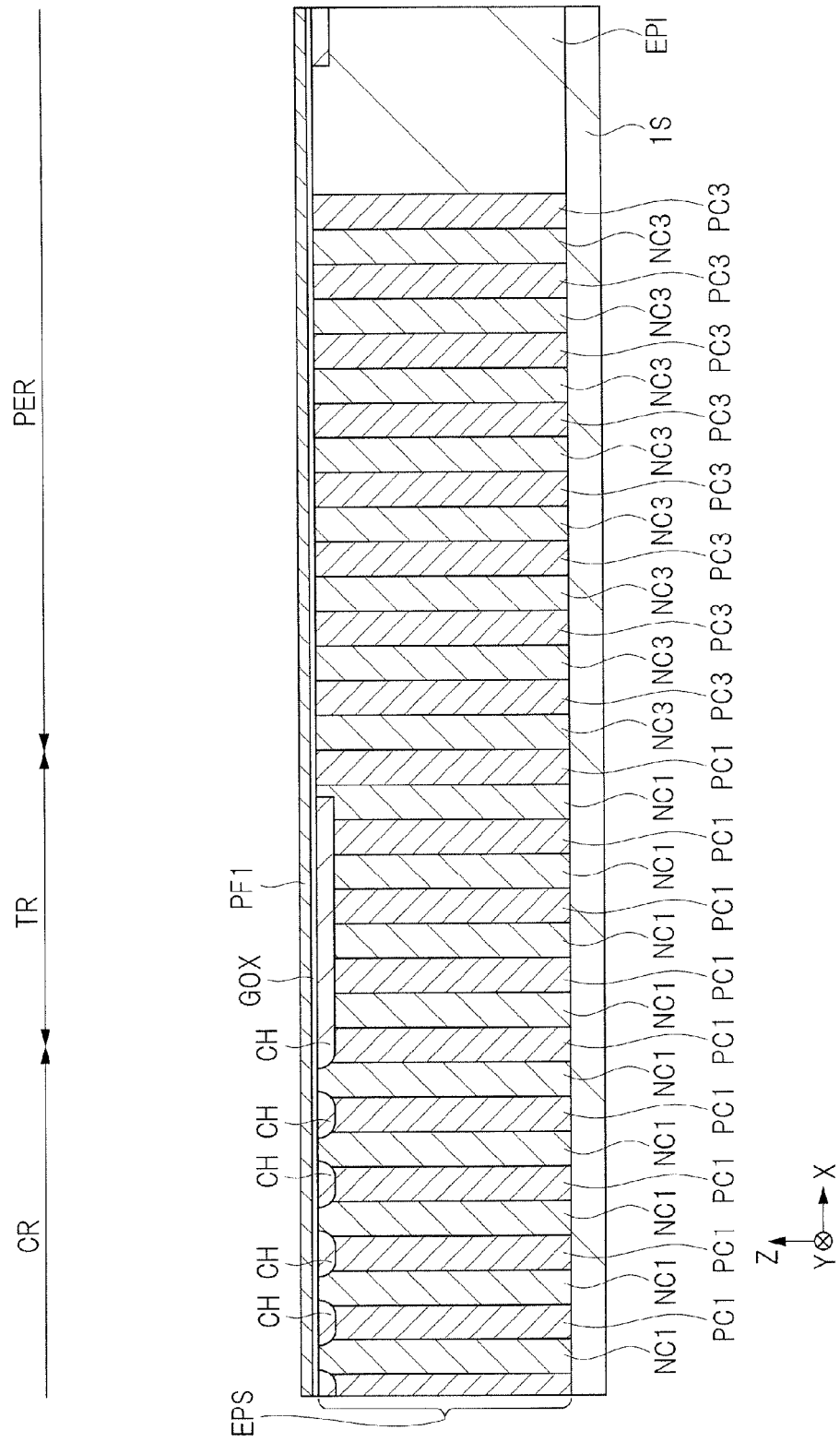
FIG. 11 is a sectional view showing a manufacturing process for the semiconductor device according to the first embodiment, and showing the manufacturing process following the manufacturing process of FIG. 10.

For example, as shown in FIG. 11, a mask film having openings in areas for forming the channel regions CH is formed by photolithography and etching. Then, using this mask film as a mask, impurity ions are implanted into the epitaxial layer EPS to form the channel regions CH. For example, ions of p-type impurity such as boron (B) are implanted as impurity ions. As a result, p-type semiconductor regions serving as the channel regions CH can be formed.

Subsequently, the above mask film is eliminated, after which the gate insulating film GOX is formed on the epitaxial layer EPS and a conductive film PF1 is formed on the gate insulating film GOX. For example, the surface of the epitaxial layer EPS is thermally oxidized to form a silicon oxide film as the gate insulating film GOX. Subsequently, a polycrystal silicon film is deposited on the silicon oxide film by CVD, etc. Instead of forming the silicon oxide film, a high dielectric film with a dielectric constant higher than that of the silicon oxide film, such as hafnium oxide film, may be formed as the gate insulating film GOX. The gate insulating film GOX may be formed by CVD, etc.

Figure 12:
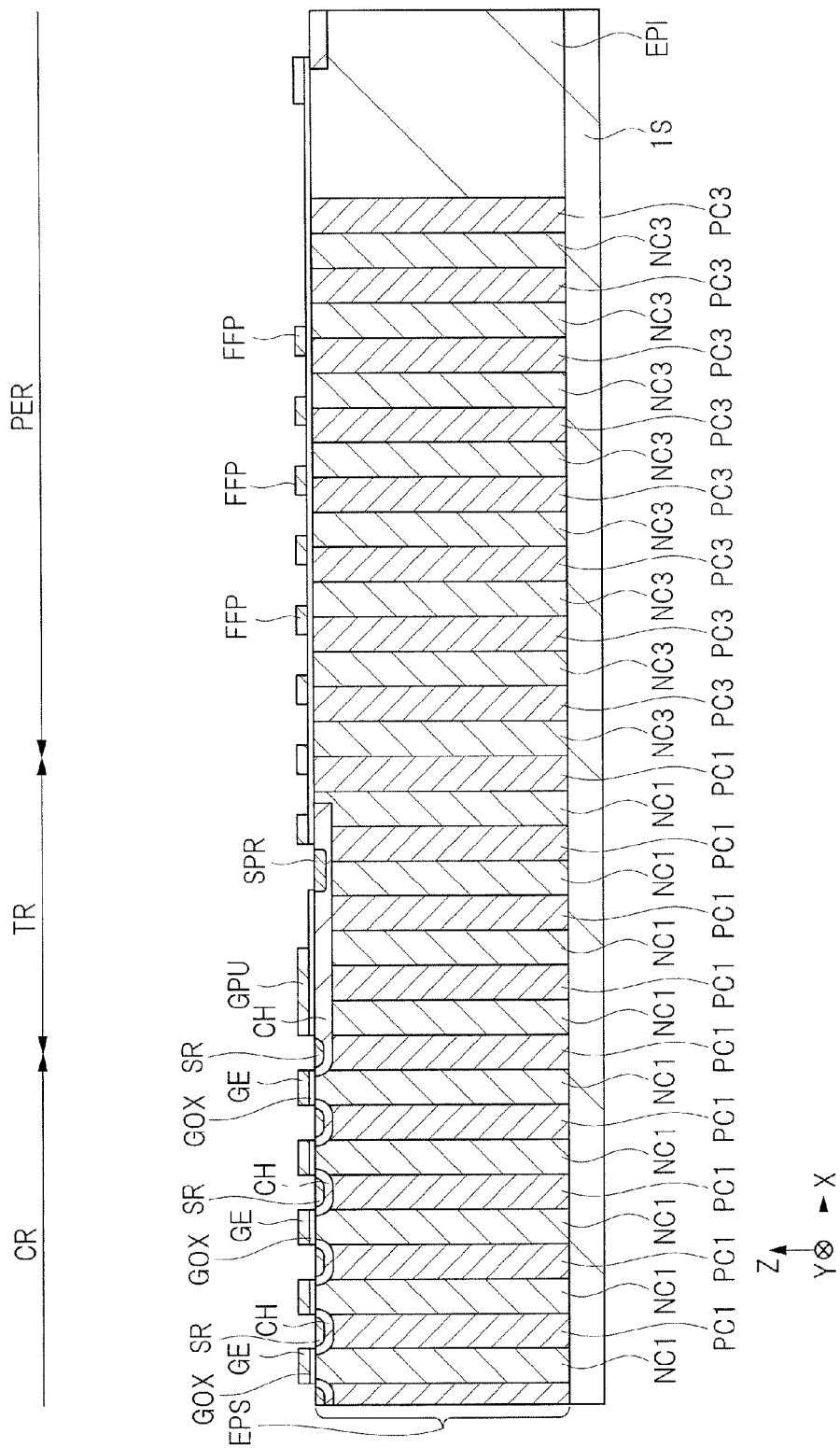
FIG. 12 is a sectional view showing a manufacturing process for the semiconductor device according to the first embodiment, and showing the manufacturing process following the manufacturing process of FIG. 10.
Figure 13:
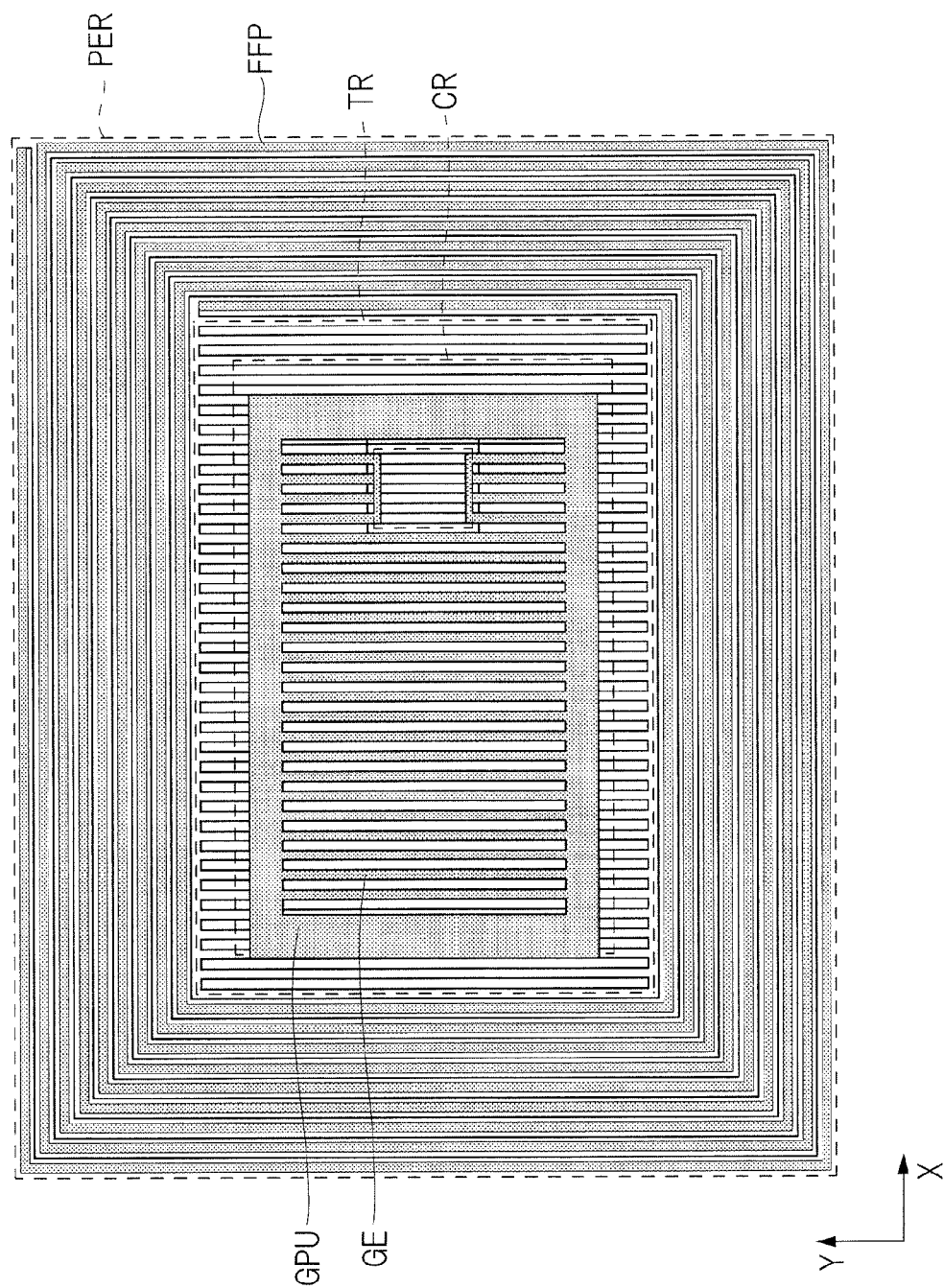
FIG. 13 is a plan view showing a manufacturing process for the semiconductor device according to the first embodiment.

Subsequently, as shown in FIG. 12, the gate electrodes GE are formed on the n-type column regions NC1. In the intermediate region TR, the gate pullout unit GPU is formed. Above the pn junction between the spiral p-type column region PC3 and the spiral n-type column region NC3, the field plate electrode FFP is formed. For example, a photoresist film covering an area for forming the gate electrodes GE, an area for forming the gate pullout unit GPU, and an area for forming the field plate electrode FFP is formed on the conductive film. PF1, which is then etched using the photoresist film as a mask. By this etching, the gate electrodes GE and field plate electrode FFP are formed. For example, as shown in FIG. 13, the gate electrodes GE are formed into linear shapes, as in the n-type column regions NC1. The gate pullout unit GPU is formed such that it is electrically connected to the plurality of gate electrodes GE. The field plate electrode FFP is formed into a spiral shape.

Figure 14:
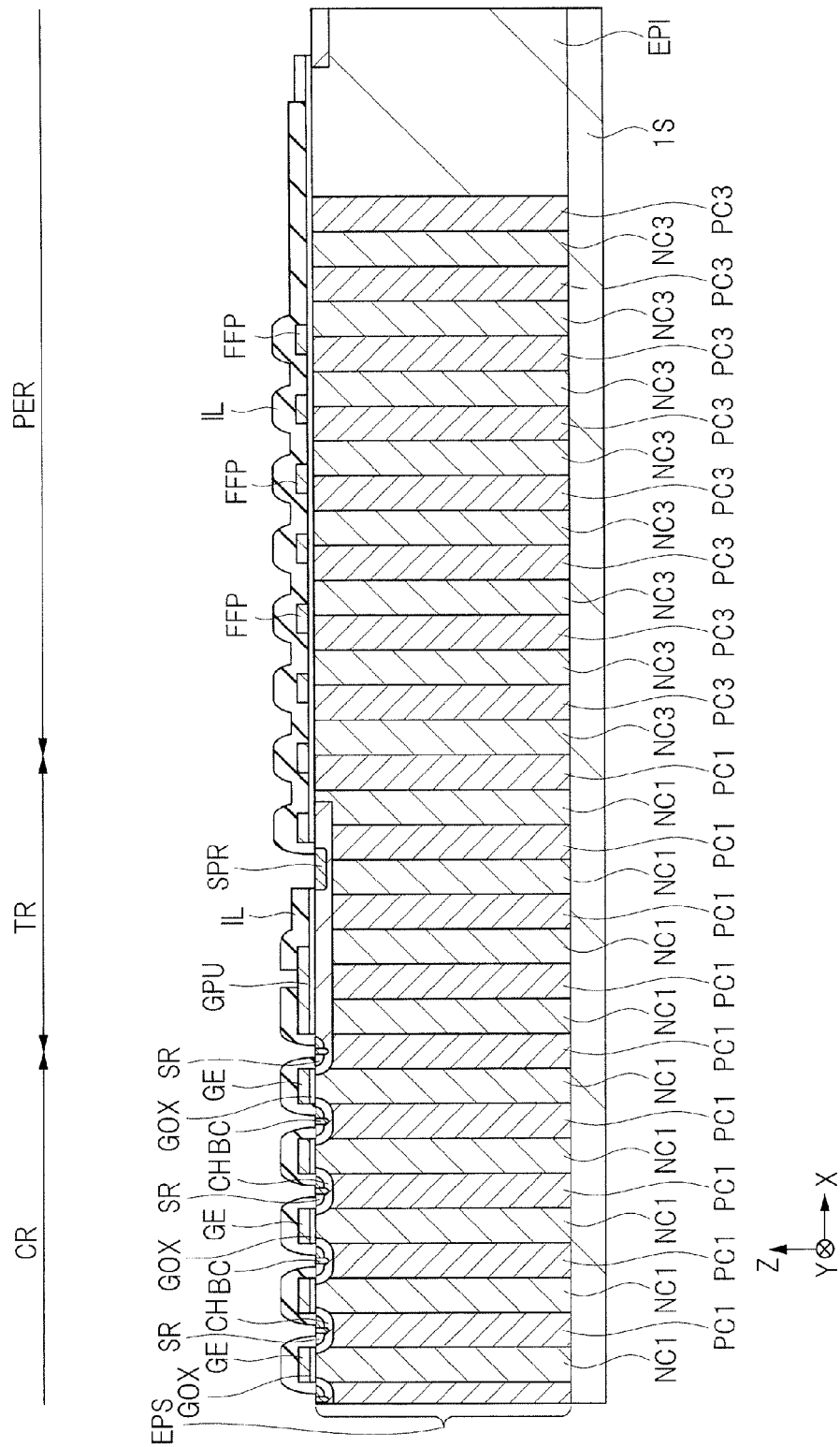
FIG. 14 is a sectional view showing a manufacturing process for the semiconductor device according to the first embodiment, and showing the manufacturing process following the manufacturing process of FIG. 12.

Subsequently, as shown in FIG. 14, the source regions SR and the source pullout region SPR are formed. For example, an area other than the area for forming the source pullout region SPR in the peripheral region PER and intermediate region TR is covered with a photoresist film, and n-type impurity ions are implanted into the epitaxial layer EPS, using the photoresist film and the gate electrodes GE in the cell region CR as a mask. For example, ions of n-type impurity such as phosphorus (P) or arsenic (As) are implanted as impurity ions. As a result, an n-type semiconductor region serving as a source region SR can be formed between each pair of gate electrodes GE in the cell region CR, and an n-type semiconductor region serving as the source pullout region SPR can be formed in the intermediate region TR. The plurality of source regions SR formed in the cell region CR are electrically connected to the source pullout region SPR formed in the intermediate region TR.

079 The interlayer insulating film IL covering the gate electrode GE, gate pullout unit GPU, and field plate electrode FFP is then formed. For example, a silicon oxide film is deposited on the gate electrodes GE, etc., by CVD. Subsequently, a photoresist film having openings in areas for forming the body contact regions BC, an opening on the gate pullout unit GPU, and an opening on the source pullout region SPR is formed on the interlayer insulating film IL. Then, using this photoresist film as a mask, the interlayer insulating film IL on the source regions SR located respectively between pairs of adjacent gate electrodes GE in the cell region CR is etched to form openings. This etching is performed as overetching by which the bottom of the openings become lower than the surface of the epitaxial layer EPS. As a result of the overetching, the source regions SR are exposed from side walls at the bottom of the openings. The interlayer insulating film IL on the gate pullout unit GPU and of the source pullout region SPR in the intermediate region TR is also etched to form openings.

Subsequently, a photoresist film covering the intermediate region TR and peripheral region PER is formed, and impurity ions are implanted into the epitaxial layer EPS, using the photoresist film and interlayer insulating film IL as a mask, to form the body contact regions BC. For example, ions of p-type impurity such as boron (B) are implanted as impurity ions. As a result, p-type semiconductor regions serving as the body contact regions BC can be formed. Each body contact region BC is located at the center of the source region SR and has a bottom reaching the channel region CH. The impurity concentration of the body contact region BC is higher than the impurity concentration of the channel region CH.

Figure 15:
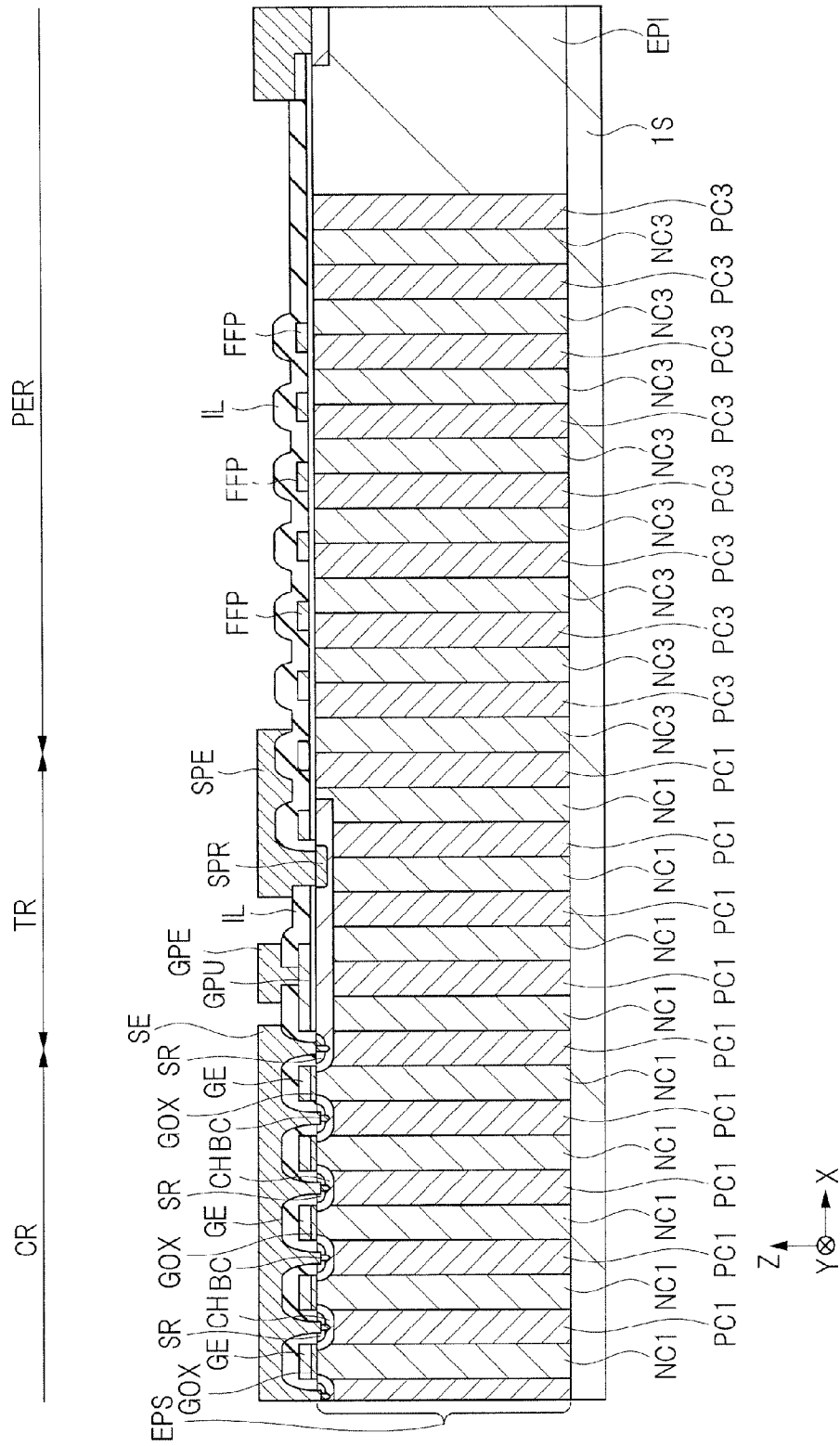
FIG. 15 is a sectional view showing a manufacturing process for the semiconductor device according to the first embodiment, and showing the manufacturing process following the manufacturing process of FIG. 14.

Subsequently, as shown in FIG. 15, the source electrode SE, the gate pullout electrode GPE, and the source pullout electrode SPE are formed. For example, a metal film is formed on the interlayer insulating film IL including the areas above the body contact regions BC, gate pullout unit GPU, and source pullout region SPR. For example, a stacked film of a titanium tungsten film and an aluminum film provided in an upper part of the titanium tungsten film is formed by sputtering, etc. The metal film is then patterned to form the source electrode SE, the gate pullout electrode GPE, and the source pullout electrode SPE. The source electrode SE in the cell region CR is electrically connected to the source regions SR and to the body contact regions BC. The gate pullout electrode GPE in the intermediate region TR is electrically connected to the gate pullout unit GPU. The source pullout electrode SPE in the intermediate region TR is electrically connected to the source pullout region SPR.

Figure 16:
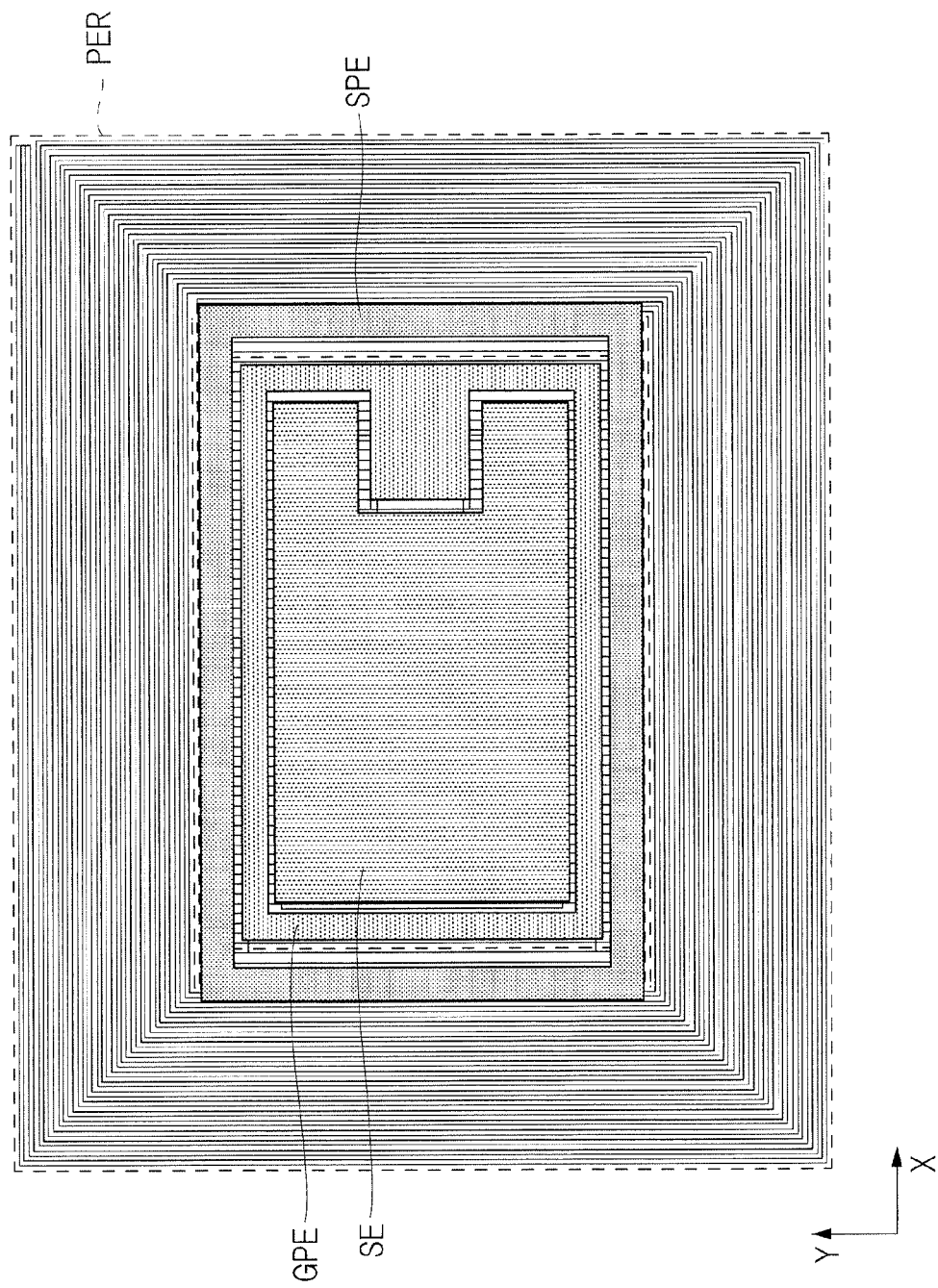
FIG. 16 is a plan view showing a manufacturing process for the semiconductor device according to the first embodiment.
Figure 17:
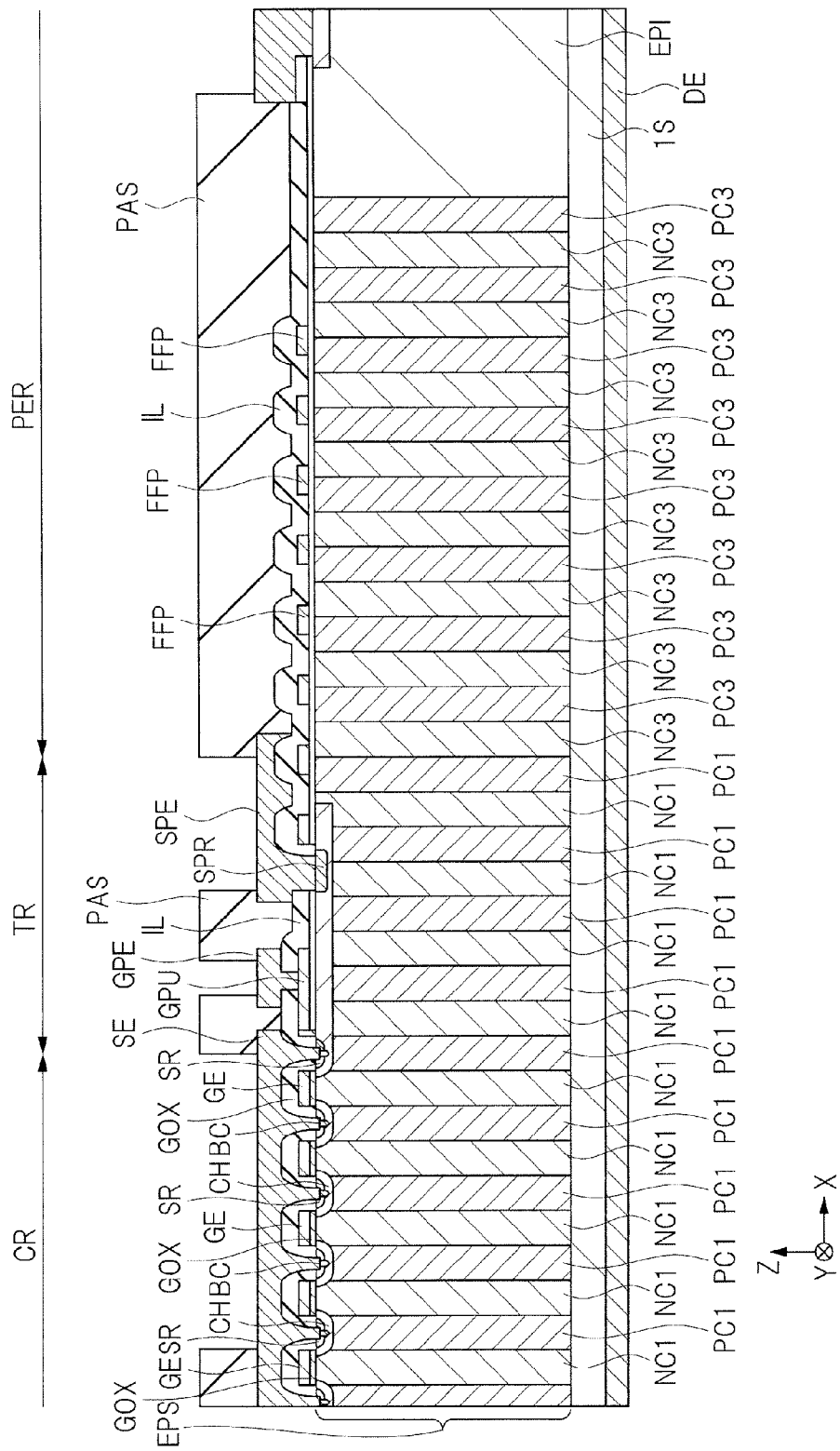
FIG. 17 is a sectional view showing a manufacturing process for the semiconductor device according to the first embodiment, and showing the manufacturing process following the manufacturing process of FIG. 15.

Subsequently, as shown in FIGS. 16 and 17, the surface protective film PAS is formed such that it covers the source electrode SE, the gate pullout electrode GPE, and the source pullout electrode SPE. The surface protective film PAS is then patterned to expose a part of the source electrode SE, a part of the gate pullout electrode GPE, and a part of the source pullout electrode SPE. These exposed parts are used as external connection regions (e.g., gate pads, source pads, etc.).

Subsequently, the semiconductor substrate 1S is ground from its back surface opposite to its main surface, to reduce its thickness, after which the drain electrode DE is formed on its back surface (see FIG. 17). For example, a metal film is formed on the back surface, which is regarded as the upper surface, of the semiconductor substrate 1S by sputtering or vapor deposition. Hence, the drain electrode DE made of the metal film can be formed.

Through the above processes, the semiconductor device of the first embodiment can be formed.

When the p-type column regions (PC1 and PC3) and n-type column regions (NC1 and NC3) are formed by the trench-fill method, as in the case of the first embodiment, the interval between each pair of p-type column regions (PC1 and PC3) and between each pair of n-type column regions (NC1 and NC3) can be reduced. As a result, the can be ensured.

That is, to reduce the on-resistance, it is preferable to increase the n-type impurity concentration of the n-type column region serving as the current path. However, increasing the n-type impurity concentration of the n-type column region suppresses the spread of the deletion layer into the n-type column region. To deplete the whole of the n-type column region, therefore, the width of the n-type column region must be reduced. The trench-fill method easily meets a demand for microfabrication of the p-type column regions (PC1 and PC3) and the n-type column regions (NC1 and NC3). Even in a case where fine trenches each having an aspect ratio of 12 or larger are formed repeatedly, the trenches can be filled precisely to form the n-type or p-type column regions by employing the trench-fill method. The aspect ratio is the depth-width ratio given by dividing the depth by the width.

On the other hand, a multi-epitaxial method is one of methods for forming the n-type or p-type column regions. According to this method, formation of n-type layers by an epitaxial growth method and formation of p-type layers by an ion implantation method are repeated to form the n-type column regions composed of a plurality of n-type layers and the p-type column regions composed of a plurality of p-type layers. In this case, implanted impurity ions spread laterally, which makes it difficult to achieve the narrow and uniform interval between the p-type column regions and between the n-type column regions. Particularly, when an aspect ratio of the p-type column region is large, the lateral spread of impurity ions at a location deep inside the epitaxial layer becomes large, so that achieving the narrow and uniform interval between the p-type column regions and between the n-type column regions becomes more difficult.

In this manner, according to the trench-fill method, the interval between the p-type column regions and between the n-type column regions can be reduced (by, for example, determining the aspect ratio of the p-type column region to be 12 or more) more effectively than in the case of employing the multi-epitaxial method. As a result, the on-resistance can be reduced and the withstand voltage can be increased. The trench-fill method is also more advantageous than the multi-epitaxial method in terms of throughput.

According to the semiconductor device of the first embodiment described in detail through the descriptions of the structure and manufacturing method, the p-type column region PC3 and n-type column region NC3 are spirally arranged in the peripheral region PER. This can alleviate electric field concentration and increase the withstand voltage.

Figure 18A:
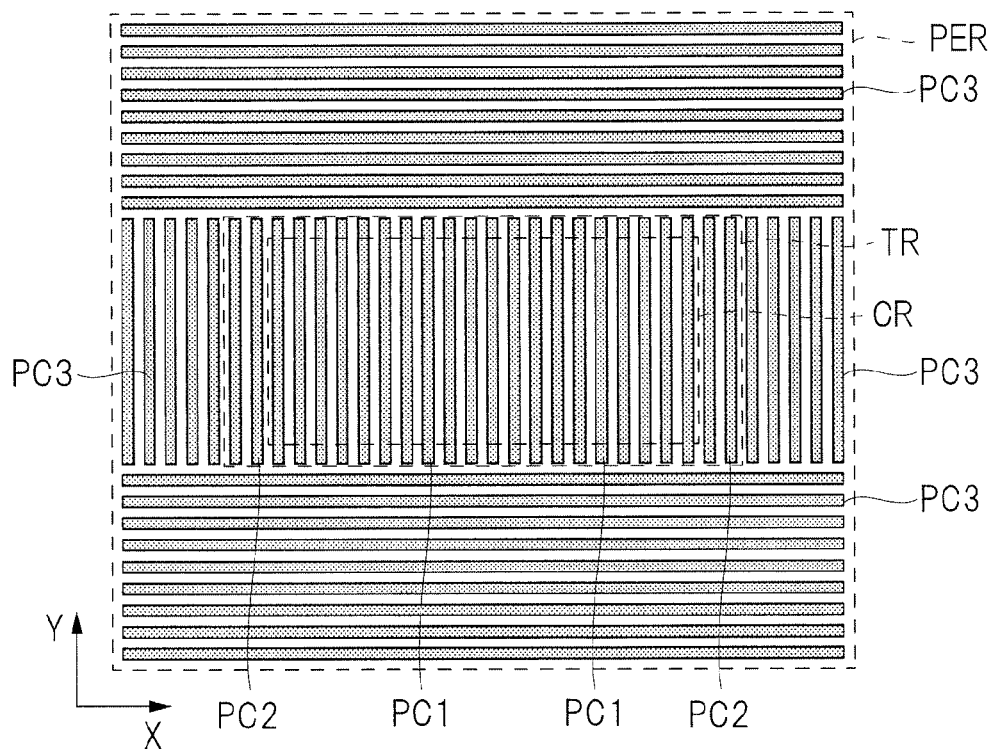
FIGS. 18A and 18B are plan views showing configurations of semiconductor devices according to a first comparison example and a second comparison example, respectively.
Figure 18B:
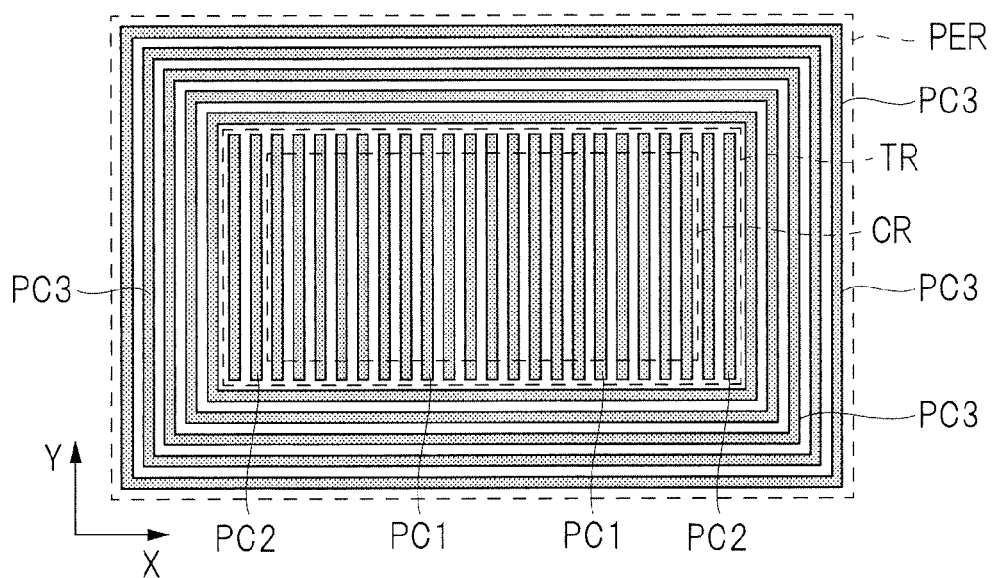

FIGS. 18A and 18B are plan views showing configurations of semiconductor devices according to a first comparison example and a second comparison example, respectively.

In the first comparison example of FIG. 18A, in the peripheral region PER, the p-type column regions PC3 and n-type column regions NC3 are arranged as linear column regions extending in the X direction or Y direction. The interval between each pair of p-type column regions PC3 is equivalent to each n-type column region NC3.

According to such a layout of the p-type column regions PC3, the linear p-type column regions PC3 extending in the X direction and the linear p-type column regions PC3 extending in the Y direction come close to each other at a proximity spot (corner or seam). It is confirmed that an electric field tends to concentrate at such a proximity spot, thus creating a hot spot there. This is because, at the proximity spot, the depletion layers spreading laterally from the pn junctions are apt to become non-uniform. Particularly, when dimensional variations are created due to inconsistent elements and manufacturing irregularities in the design stage, the interval between the p-type column regions PC3 widens, which may lead to a drop in a withstand voltage margin.

In the second comparison example of FIG. 18B, in the peripheral region PER, the p-type column regions PC3 surrounding the intermediate region TR are multiply-formed. The interval between each pair of p-type column regions PC3 is equivalent to each n-type column region NC3. According to such a layout of the p-type column regions PC3, the p-type column regions PC3 extending in the X direction and the same extending in the Y direction are connected to each other at the above proximity spot (corner or seam). As a result, a drop in the withstand voltage margin caused by the hot spot is avoided. However, because the intermediate region TR is surrounded by individual loops of p-type column regions PC3 in which each loop of the p-type column is a closed loop (also the same in individual loops of n-type column regions NC3), a potential difference at each looped column region tends to become greater (see FIG. 22). This may lead to a drop in the withstand voltage margin, in which case when a high voltage is applied locally, dielectric breakdown occurs at the applied voltage which is lower than the design-based withstand voltage, for example.

Figure 19:
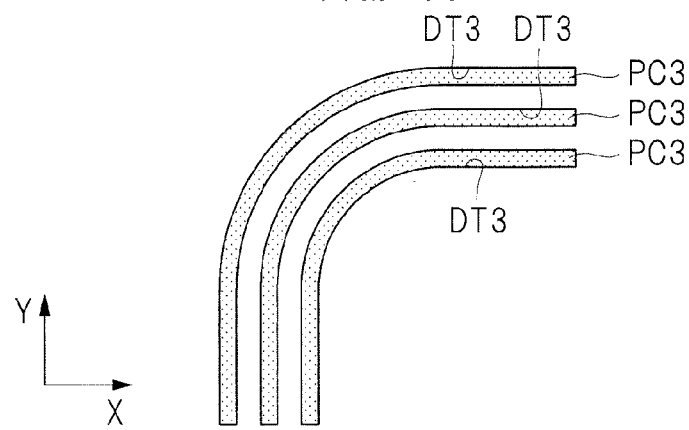
FIG. 19 is a plan view showing a configuration of a semiconductor device according to a third comparison example.

As shown in FIG. 19, the corners of the p-type column regions PC3 surrounding the intermediate region TR may be rounded. FIGS. 19 and 20 are plan views of a configuration of a semiconductor device according to a third comparison example.

Figure 20A:
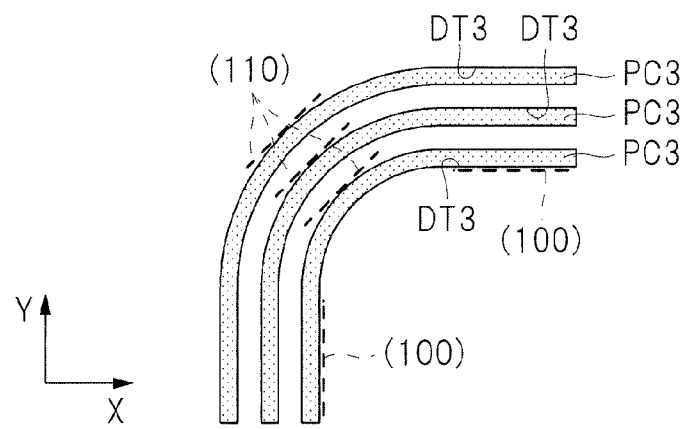
FIGS. 20A and 20B are plan views showing the configuration of the semiconductor device according to the third comparison example.
Figure 20B:
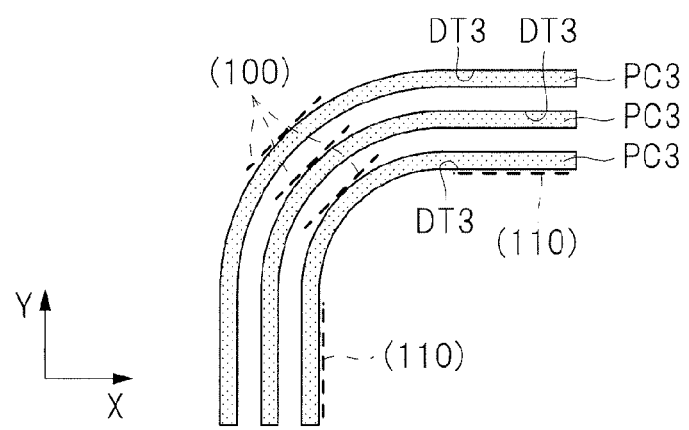

When the corners of the p-type column regions PC3 are rounded, as shown in FIG. 19, an insufficient filling of the epitaxial layer EP is apt to occur at a rounded spot. That is, the trench DT3 has a side face extending in the X direction and a side face extending in the Y direction. As shown in FIG. 20, these side faces are a (100) plane or (110) plane. For example, as shown in FIG. 20A, when a corner constituted with a side face of the (100) plane exposed is rounded, the (110) plane is exposed at a rounded spot. As shown in FIG. 20B, when a corner constituted with a side face of the (110) plane exposed is rounded, the (100) plane is exposed at a rounded spot. In this manner, when the epitaxial layer EP is grown by the epitaxial growth method (crystal growth method) from side faces having different plane orientations, a growth rate of the epitaxial layer EP varies depending on a plane orientation. In such a case, when the growth rate becomes lower at the rounded spot, an insufficient filling is created. When the growth rate becomes higher, on the other hand, a defect, such as crystal transition, is created at the junction between the growth surface and the side wall of the trench DT3.

In contrast, according to the first embodiment, the trench DT3 is formed into a spiral shape with corners (see FIG. 7), where the side face extending in the X direction and the side face extending in the Y direction are constituted with, for example, a (100) plane or a (110) plane. As a result, the filling characteristics of the epitaxial layer EP can be improved. In other words, the side face extending in the X direction and the side face extending in the Y direction correspond to the (100) plane or (110) plane, as a result of which the filling characteristics of the epitaxial layer EP can be improved.

A side face corresponding to the (100) plane or (110) plane refers to a side face formed by using a reticle pattern tracing the pattern of the (100) plane or (110) plane. In this case, the side face extending in the X direction and the side face extending the Y direction are patterned into the (100) plane or (110) plane according to the reticle pattern. In actual situations, however, because of an etching shift, etc., the side faces of the post-etching trench DT3 are composed of the nearly (100) plane or the nearly (110) plane. In other words, the side faces may include a plane other than the (100) plane or (110) plane. The first embodiment does not exclude such a case of including a plane other than the (100) plane or (110) plane.

Figure 21:
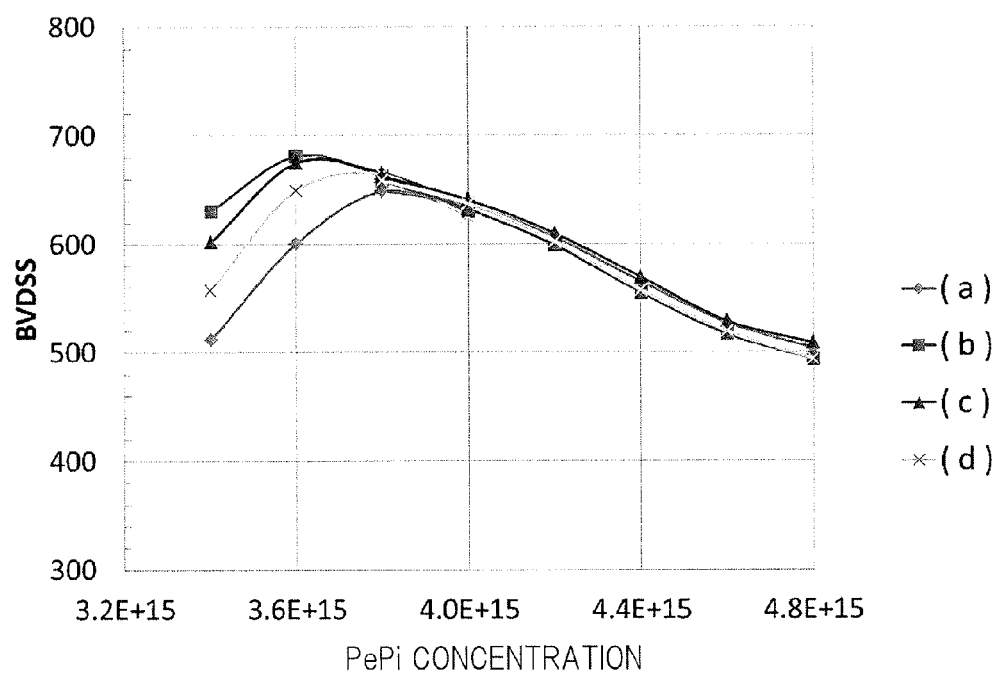
FIG. 21 is a graph showing a relation between a withstand voltage and a concentration of the semiconductor device of the first embodiment and the semiconductor devices of the comparison examples.

FIG. 21 is a graph showing a relation between the withstand voltage and the concentration of the semiconductor device of the first embodiment and the semiconductor devices of the comparison examples. The horizontal axis represents the concentration of the p-type column region (Pepi concentration), and the vertical axis represents the withstand voltage (BVDSS or withstand voltage at the pn junction). "3.45+15" stands for "$3.4 \times 10^{15}$".

In the graph of FIG. 21, a graphic curve (a) represents the withstand voltage/impurity concentration relation of the semiconductor device of the first comparison example (see FIG. 18A), a graphic curve (b) represents the withstand voltage/impurity concentration relation of the semiconductor device of the first embodiment (see FIGS. 2 and 3), a graphic curve (c) represents the withstand voltage/impurity concentration relation of the semiconductor device of the second comparison example (see FIG. 18B), and a graphic curve (d) represents the withstand voltage/impurity concentration relation of the semiconductor device of the first embodiment not equipped with the field plate electrode.

Observing the graphic curves (a) to (d) reveals that a withstand voltage peak (maximum value) appears at about 660 V on the graphic curve (a), at about 680 V on the graphic curve (b), and at about 670 V on the graphic curve (c). This demonstrates the fact that according to the first embodiment, the withstand voltage is increased to be higher than that of the first and second comparison examples. The withstand voltage is increased especially in the low-concentration range.

The graphic curve (b) indicates that its curvature near the peak is smaller than that of the graphic curves (a) and (c), which means that a drop in the withstand voltage is small, compared to the graphic curves (a) and (c). This indicates the fact that even if the concentration of the p-type column region changes due to manufacturing irregularities, etc., a high withstand voltage can be maintained in a wide concentration range. For example, the graphic curve (a) has a concentration margin of about $0.6 \times 10^{15}$ cm$^{-3}$ for the withstand voltage of 600 V. The graphic curve (b) however, has a larger concentration margin of about $0.9 \times 10^{15}$ cm$^{-3}$ for the withstand voltage of 600 V.

Comparing the graphic curve (b) with the graphic curve (c) leads to a conclusion that the p-type column regions have better characteristics when having a "spiral structure", but not a "multiple-loop structure". In comparison with the graphic curve (c), the graphic curve (b) shows a higher withstand peak (maximum value) and a smaller curvature near the peak.

Figure 22:
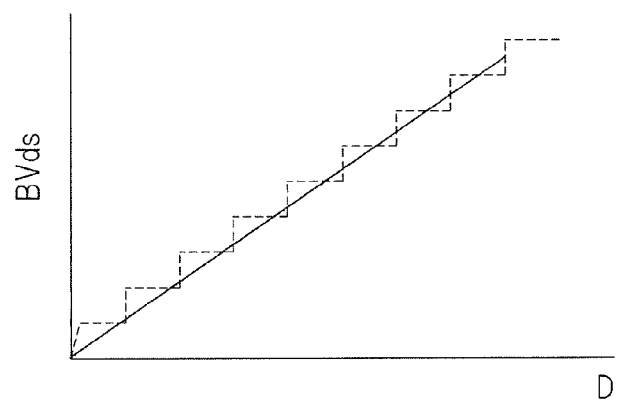
FIG. 22 is a graph schematically showing a relation between a distance to an intermediate region and a withstand voltage in a peripheral region.

This is because that by spirally arranging the p-type column region PC3 (n-type column region NC3), the continuity of the p-type column region PC3 (n-type column region NC3) is maintained, as a result of which electric field concentration is alleviated step by step toward the outer periphery and therefore the withstand voltage is further increased. FIG. 22 is a graph schematically showing a relation between the distance D to the intermediate region TR and the withstand voltage BVds in the peripheral region PER. In the case of the first embodiment in which the p-type column region PC3 is spirally arranged, a linear graph indicated by a continuous line is shown. In contrast, in the case of the second comparison example in which a plurality of loops of the p-type column regions PC3 are arranged, each loop of the p-type column region PC3 creates a potential difference, so that a stepped graph indicated by a broken line is shown. In this manner, by spirally arranging the p-type column region PC3, electric field concentration is alleviated step by step toward the outer periphery and therefore the withstand voltage is further increased.

When the p-type column regions are configured to have a "spiral structure", but not to have a "multiple-loop structure", an internal stress that is created when the trenches are filled with the epitaxial layer EP can be reduced. For example, when the trenches of the "multiple-loop structure" are filled with the epitaxial layer EP, growth layers collide at the corners, which may create a high stress in the epitaxial layer EP. When the trench of the "spiral structure" is filled with the epitaxial layer EP, in contrast, because the trench has a continuous spiral shape, in other words, the trench is not closed, so that a stress in the epitaxial layer EP is reduced. For this reason, the filling characteristics of the epitaxial layer EP can be improved when the p-type column regions have a "spiral structure", but not a "multiple-loop structure".

Comparing the graphic curve (b) with the graphic curve (d) leads to a conclusion that not having the field plate electrode leads to a drop in the withstand voltage. As described above, the field plate electrode plays a role of alleviating electric field concentration. The comparison result, therefore, indicates that alleviating electric field concentration produces the effect of an increase in the withstand voltage and of an increase in the concentration margin. These conclusions support the validity of the above observations. Each of the graphic curves (a) to (c) other than the graphic curve (d) represents data of the semiconductor device having the field plate electrode.

In this manner, according to the first embodiment, the p-type column region and n-type column region are spirally arranged in the peripheral region PER, and therefore electric field concentration is alleviated, the withstand voltage can be increased, and the concentration margin can also be increased.

Second Embodiment

A second embodiment will be described as various application examples. The same components as described in the first embodiment, etc., will be denoted by the same reference numerals or related reference numerals and will not be described repeatedly.

First Application Example

According to the first embodiment (FIG. 3), the linear p-type column regions PC1 are arranged in the cell region CR and intermediate region TR while the spiral p-type column region PC3 is arranged in the peripheral region PER. The p-type column regions in the intermediate region TR, however, may be formed into a spiral column region.

Figure 23:
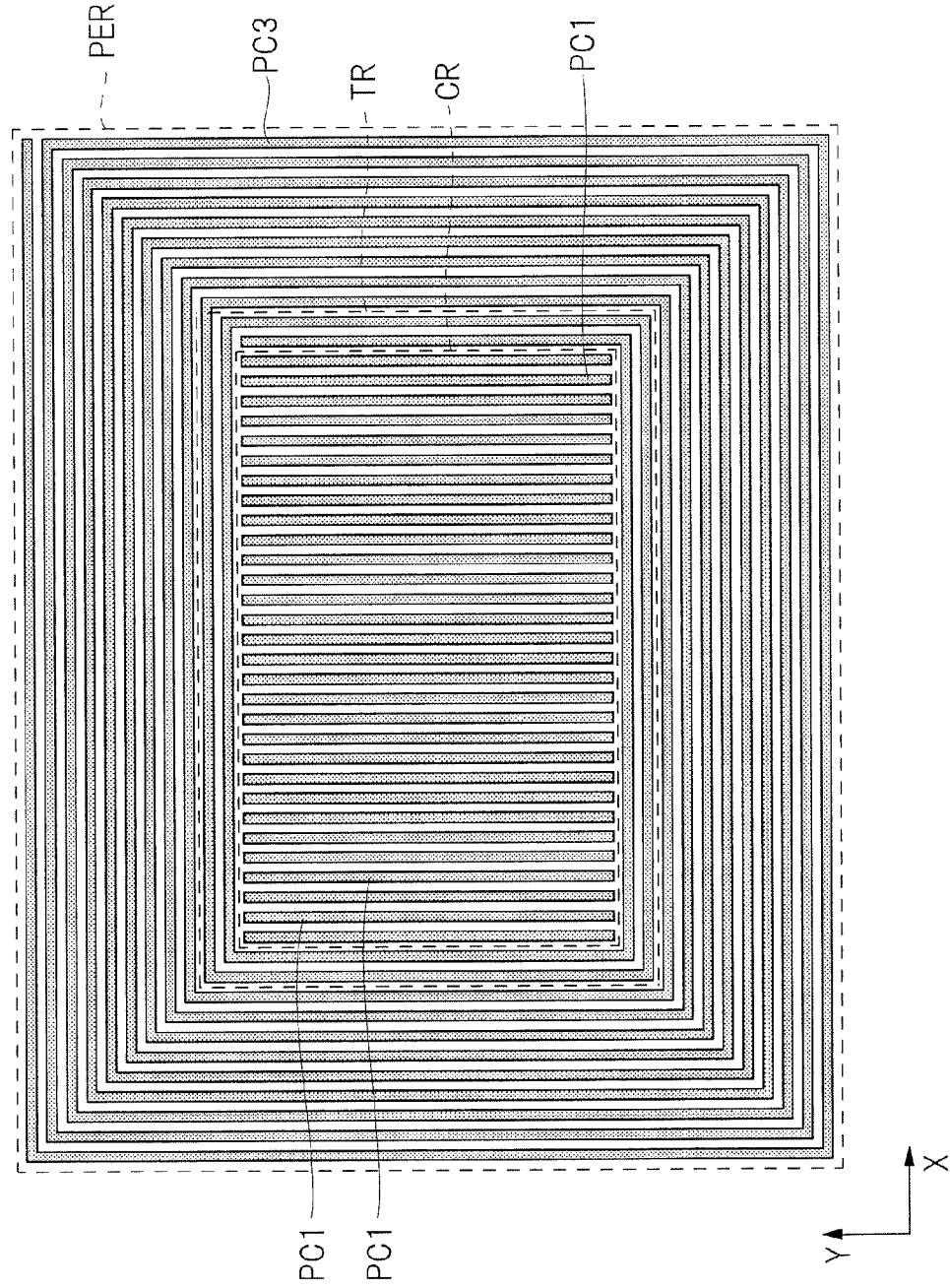
FIG. 23 is a plan view showing a configuration of a semiconductor device according to a first application example of a second embodiment.

FIG. 23 is a plan view showing a configuration of a semiconductor device according to a first application example of the second embodiment. The semiconductor device of the first application example is identical with the semiconductor device of the first embodiment, except the configuration of the p-type column region and n-type column region in the intermediate region TR.

As shown in FIG. 23, according to the first application example, the linear p-type column regions PC1 and the linear p-type column regions NC1 are arranged alternately in the cell region CR. Meanwhile, in the intermediate region TR and the peripheral region PER, the spiral p-type column region PC3 and the spiral n-type column region NC3 are arranged.

Specifically, as shown in FIG. 23, in the intermediate region TR, the first loop of the p-type column is arranged so as to surround the cell region CR from a corner of the rectangular region demarcating the cell region CR. In continuous with the first loop of the p-type column, the second loop of the p-type column is then arranged so as to surround the first loop of the p-type column. In this manner, in FIG. 23, the first loop and second loop of p-type columns are arranged in the intermediate region TR.

In the peripheral region PER, in continuous with the second loop of the p-type column, the third loop of the p-type column is arranged so as to surround the second loop of the p-type column, and in continuous with the third loop of the p-type column, the fourth loop of the p-type column is arranged so as to surround the third loop of the p-type column. In this manner, in FIG. 23, the third loop to the eleventh loop of p-type columns are arranged in the peripheral region PER. The interval between each pair of loops of the p-type column region PC3 is equivalent to the n-type column region NC3.

The semiconductor device of the first application example can be manufactured by the same manufacturing processes as carried out in the first embodiment, using the reticle whose pattern used for forming the trenches DT3 is changed to the pattern corresponding to the shape of the p-type column regions PC1 and PC3.

In this manner, arranging the spiral p-type column region PC3 (N-type column regions NC3) in the intermediate region TR also achieves the same effect as achieved by the first embodiment.

Second Application Example

According to the first embodiment (FIG. 3), the corner Ca of the rectangular region demarcating the intermediate region TR is designated as the starting point and the first loop of the p-type column is arranged so as to surround the intermediate region TR from the starting point, however, this starting point may be changed. A second application example is identical in configuration with the first embodiment, except that the second application example includes a starting point S of the spiral p-type column region PC3.

Figure 24A:
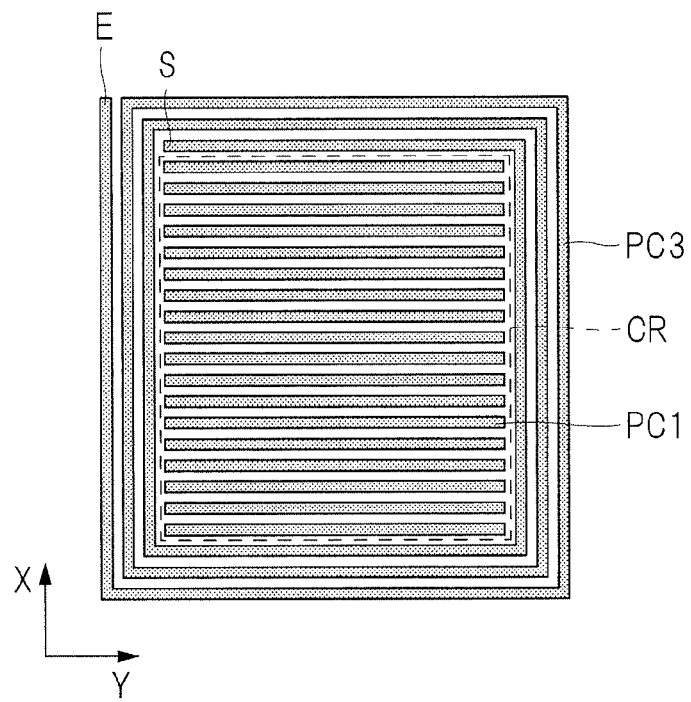
FIGS. 24A and 24B are plan views for explaining a configuration of a semiconductor device according to a second application example of the second embodiment.
Figure 24B:
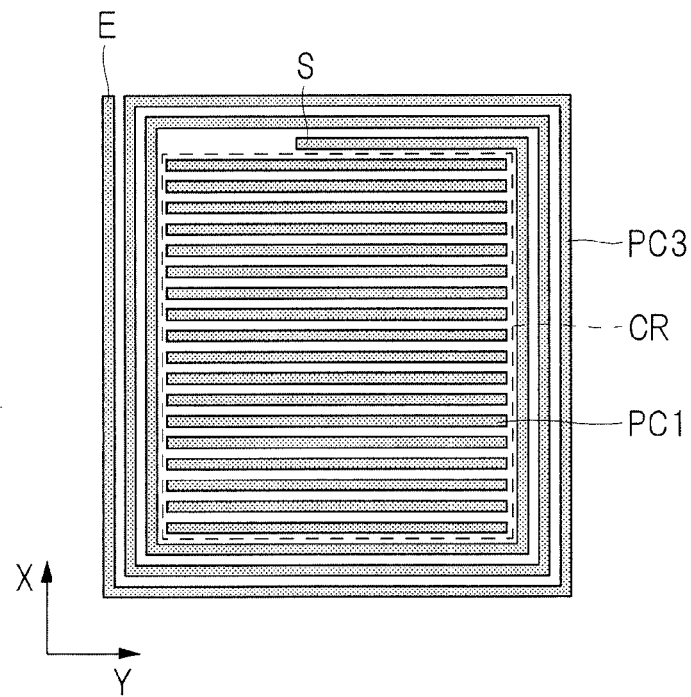

FIGS. 24A and 24B are plan views for explaining a configuration of a semiconductor device according to the second application example of the second embodiment. In FIG. 24A, a corner is designated as a starting point, as in the first embodiment. Specifically, a corner of the rectangular region demarcating the cell region CR is designated as a starting point S, and the first loop of the p-type column is arranged so as to surround the cell region CR from the starting point S. Since the intermediate region TR may be formed as a part of the cell region CR or a part of the peripheral region PER, the illustration of the intermediate region TR is omitted from FIG. 24A (also from FIGS. 25 to 29).

In FIG. 24B, in contrast, the corner is not designated as the starting point S, but the starting point S is designated so as to correspond to a halfway point of a side of the rectangular cell region CR that extends in the Y direction (upper side of the cell region CR in FIG. 24B). To put it another way, the starting point S is designated such that it corresponds to the halfway point of the outermost p-type column region PC1 in the cell region CR.

By displacing (moving) the starting point S away from the corner of the cell region CR in such a manner, a part where a hot spot may develop or destruction may occur can be transferred to a location less subjected to negative impact.

At the corner, in comparison with the linear part, the depletion layer spreading laterally from the pn junction tends to become non-uniform. For this reason, the withstand voltage at the corner becomes lower than the withstand voltage at the linear part. When a hot spot actually develops or destruction actually occurs at the corner, such a hot spot or destruction is likely to cause a fatal defect.

By displacing (moving) the starting point S of the spiral p-type column region PC3 away from the corner of the cell region CR, therefore, even if an unexpected overvoltage is applied, a part assumed to be destroyed by dielectric breakdown is transferred to a stable location, so that the development of a fatal defect is suppressed. Obviously, the second application example achieves the same effect achieved by the first embodiment.

The semiconductor device of the second application example can be manufactured by the same manufacturing processes as carried out in the first embodiment, using the reticle whose pattern used for forming the trenches DT3 is changed to the pattern corresponding to the shape of the p-type column regions PC3.

According to the second application example, a halfway point of the first side of the rectangular cell region CR that extends in the Y direction (upper side of the cell region CR in FIG. 24B) is designated as the starting point S. However, a halfway point of the second side or the other sides after the second side may be designated as the starting point S.

Third Application Example

In the second application example (FIG. 24), the starting point S of the p-type column region PC3 is displaced away from the corner of the cell region CR; however, a dummy p-type column region DC may be formed in a region that is formed by displacing the starting point S. A third application example is identical in configuration with the second application example, except that the third application example includes the dummy p-type column region DC.

Figure 25:
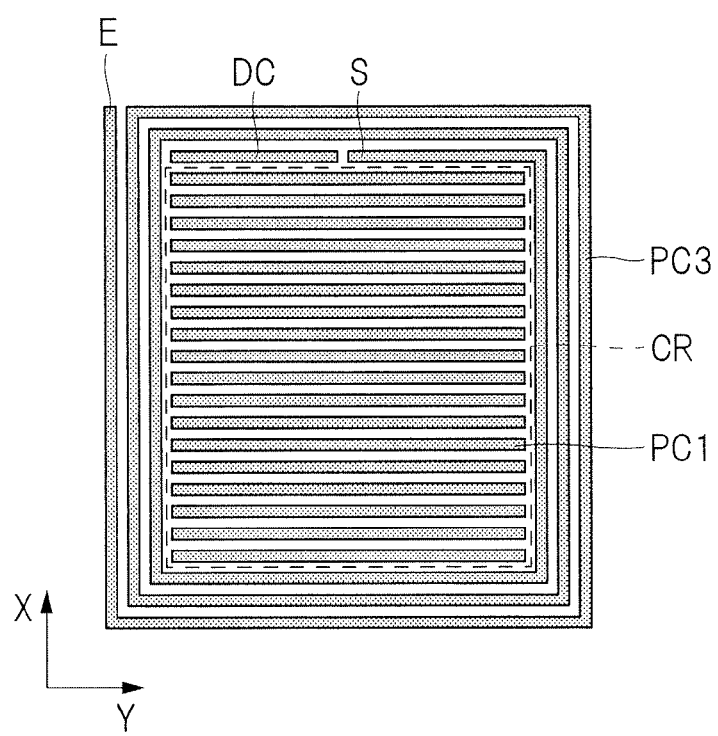
FIG. 25 is a plan view showing a configuration of a semiconductor device according to a third application example of the second embodiment.

FIG. 25 is a plan view showing a configuration of a semiconductor device according to a third application example of the second embodiment. In the same manner as in the second application example, according to the third application example, in the peripheral region PER, a point displaced away from the corner of the rectangular region demarcating the cell region CR is designated as the starting point S, and the first loop of the p-type column is arranged so as to surround the cell region CR from the starting point S. In continuous with the first loop of the p-type column, the second loop of the p-type column is arranged so as to surround the first loop of the p-type column. In this case, the first side of the first loop of the p-type column extends in the Y direction, from a halfway point of the side of the rectangular cell region CR that extends in the Y direction (upper side of the cell region CR in FIG. 25). The second side of the first loop of the p-type column extends along a side of the rectangular cell region CR that extends in the X direction (right side of the cell region CR in FIG. 25). The third side of the first loop of the p-type column extends along a side of the rectangular cell region CR that extends in the Y direction (lower side of the cell region CR in FIG. 25). The fourth side of the first loop of the p-type column extends along a side of the rectangular cell region CR that extends in the Y direction (left side of the cell region CR in FIG. 25). The first side of the first loop of the p-type column is, therefore, shorter than the third side of the same.

According to the third application example, the dummy p-type column region DC is formed between the corner of the rectangular cell region CR and the starting point S of the p-type column region PC3 that is located at the halfway point of the side of the rectangular cell region CR that extends in the Y direction (upper side of the cell region CR in FIG. 24A).

Because the dummy p-type column region DC is formed in this manner, a deletion layer spreads laterally from a pn junction formed by the dummy p-type column region DC. As a result, the withstand voltage at the vicinity of the dummy p-type column region DC can be increased. Obviously, the third application example achieves the same effect achieved by the first embodiment.

The semiconductor device of the third application example can be manufactured by the same manufacturing processes as carried out in the first embodiment, using the reticle whose pattern used for forming the trenches DT3 is changed to the pattern corresponding to the shape of the p-type column regions PC3.

Fourth Application Example

According to the first embodiment (FIG. 3), the p-type column region PC3 in the peripheral region PER is spirally arranged such that the interval between the (n−1)-th loop of the p-type column and the n-th loop of the p-type column is determined to be equal. However, the interval between the (n−1)-th loop of the p-type column and the n-th loop of the p-type column may be changed. A fourth application example is identical in configuration with the first embodiment except that the interval between the (n−1)-th loop of the p-type column and the n-th loop of the p-type column in the p-type column region PC3 is changed in the fourth application example.

Figure 26A:
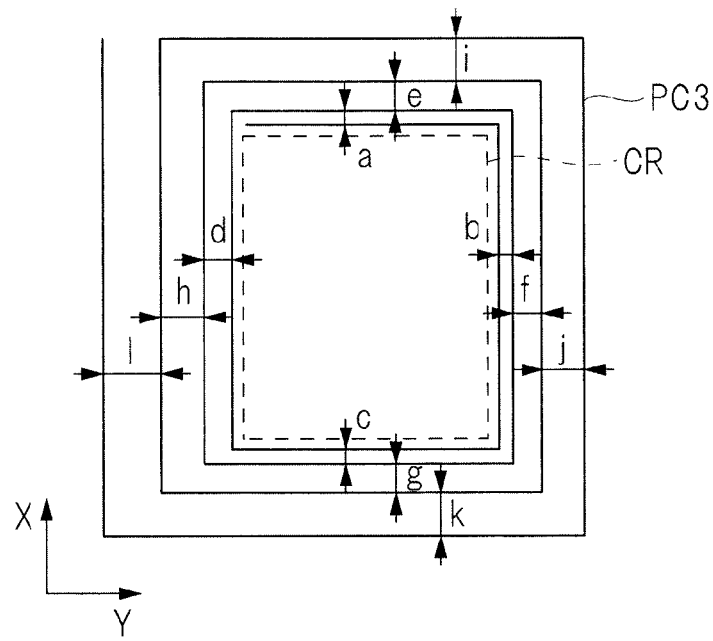
FIG. 26A is a plan view for explaining a configuration of a semiconductor device according to a fourth application example of the second embodiment.
Figure 26B:
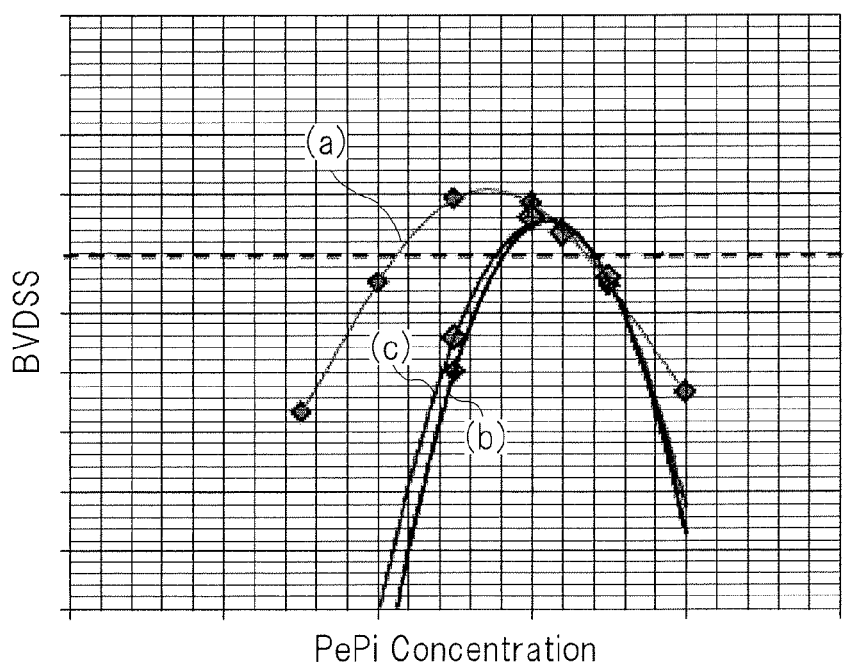
FIG. 26B is a graph showing a relation between a withstand voltage and a concentration of the semiconductor device according to the fourth application example of the second embodiment.

FIG. 26A is a plan view for explaining a configuration of a semiconductor device according to the fourth application example of the second embodiment, and FIG. 26B is a graph showing a relation between the withstand voltage and the concentration of the semiconductor device according to the fourth application example of the second embodiment. The horizontal axis represents the concentration of the p-type column region (Pepi concentration), and the vertical axis represents the withstand voltage (BVDSS or withstand voltage at the pn junction).

The p-type column region PC3 shown in FIG. 26A is spirally arranged. In FIG. 26A, however, the intervals (a, e, i) between the (n−1)-th loop of the p-type column and the n-th loop of the p-type column are different. These intervals (a, e, i) have a size relation of a<e<i.

Specifically, in the p-type column region PC3, the first loop of the p-type column is arranged so as to surround the cell region CR from the corner (starting point) of the rectangular region demarcating the cell region CR, and that in continuous with the first loop of the p-type column, the second loop of the p-type column is arranged so as surround the first loop of the p-type column. The interval between the first loop of the p-type column and the second loop of the p-type column is the uniform interval a. In FIG. 26A, the intervals a, b, c, and d are equal to each other.

In continuous with the second loop of the p-type column, the third loop of the p-type column is arranged so as to surround the second loop of the p-type column. The interval between the second loop of the p-type column and the third loop of the p-type column is the uniform interval e. In FIG. 26A, the intervals e, f, g, and h are equal to each other.

In continuous with the third loop of the p-type column, the fourth loop of the p-type column is arranged so as to surround the third loop of the p-type column. The interval between the third loop of the p-type column and the fourth loop of the p-type column is the uniform interval i. In FIG. 26A, the intervals i, j, k, and l are equal to each other.

In this manner, the first loop of the p-type column to the n-th loop of the p-type column may be arranged such that the interval between different columns is widened with respect to each loop of the columns.

In this manner, respective intervals (pitches) between different columns ranging from the first loop of the p-type column to the n-th loop of the p-type column can be varied in size. This allows the withstand voltage to be adjusted in a balanced manner with respect to each location in the peripheral region PER and allows the withstand voltage of the cell region CR and peripheral region PER to be adjusted in a balanced manner. For example, the withstand voltage can be adjusted in a balanced manner by reducing the interval between the p-type columns inside the cell region CR and in the inner area of the peripheral region PER that is close to the cell region CR and by widening the interval between p-type columns as the p-type columns are further distanced from the cell region CR.

The fourth application example is described as the case where the interval between the (n−1)-th loop of the p-type column and the n-th loop of the p-type column (intervals a, e, and i) have the size relation of a<e<i. This size relation may be determined to be, for example, a=e<i or a>e>i.

Obviously, the fourth application example achieves the same effect achieved by the first embodiment.

The semiconductor device of the fourth application example can be manufactured by the same manufacturing processes as carried out in the first embodiment, using the reticle whose pattern used for forming the trenches DT3 is changed to the pattern corresponding to the shape of the p-type column regions.

As shown in FIG. 26B, by changing the interval between the (n−1)-th loop of the p-type column and the n-th loop of the p-type column, the withstand voltage of the peripheral region PER can adjusted in a balanced manner. A graphic curve (a) represents a withstand voltage balance in the cell region CR, in which the ratio between the width of the p-type column region and the width of the n-type column region (P/N) is 5/6. A graphic curve (b) represents a withstand voltage balance in the peripheral region PER, in which the ratio between the width of the p-type column region and the width of the n-type column region (P/N) is 5/6. A graphic curve (c) represents a withstand voltage balance in the peripheral region PER, in which the ratio between the width of the p-type column region and the width of the n-type column region (P/N) is variable, ranging from 5/6, 5.9, 5.8 and 5.7.

Fifth Application Example

According to the fourth application example (FIG. 26A), the first loop of the p-type column to the n-th loop of the p-type column are arranged such that the interval between different columns is changed with respect to each loop of the columns. However, the interval may be changed by designating a corner of each loop of the p-type column as a starting point.

Figure 27:
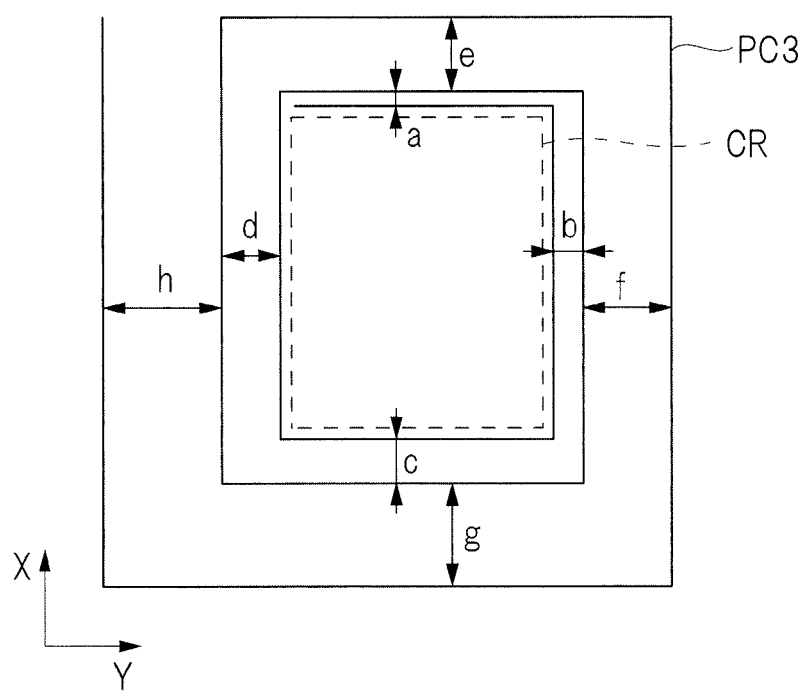
FIG. 27 is a plan view for explaining a configuration of a semiconductor device according to a fifth application example of the second embodiment.

FIG. 27 is a plan view for explaining a configuration of a semiconductor device according to a fifth application example of the second embodiment. The p-type column region PC3 shown in FIG. 27 is spirally arranged, and in the peripheral region, by designating the corner of the rectangular region demarcating the cell region CR as the starting point, the first loop of the p-type column is arranged so as to surround the cell region CR from the starting point. In continuous with the first loop of the p-type column, the second loop of the p-type column is arranged so as surround the first loop of the p-type column. The first side of the first loop of the p-type column extends in the Y direction along the side of the rectangular cell region CR that extends in the Y direction (upper side of the cell region CR in FIG. 27). The second side of the first loop of the p-type column extends along the side of the rectangular cell region CR that extends in the X direction (right side of the cell region CR in FIG. 27). The third side of the first loop of the p-type column extends along the side of the rectangular cell region CR that extends in the Y direction (lower side of the cell region CR in FIG. 27). The fourth side of the first loop of the p-type column extends along the side of rectangular cell region CR that extends in the X direction (left side of the cell region CR in FIG. 27). The first side of the second loop of the p-type column extends in the Y direction along the first side of the first loop of the p-type column. The interval between the first side of the second loop of the p-type column and the first side of the first loop of the p-type column is the interval a. The second side of the second loop of the p-type column extends in the X direction along the second side of the first loop of the p-type column. The interval between the second side of the second loop of the p-type column and the second side of the first loop of the p-type column is the interval b. The intervals a and b have a size relation of b>a. The third side of the second loop of the p-type column extends in the Y direction along the third side of the first loop of the p-type column. The interval between the third side of the second loop of the p-type column and the third side of the first loop of the p-type column is the interval c. The intervals a, b, and c have a size relation of c>b>a. The fourth side of the second loop of the p-type column extends in the X direction along the fourth side of the first loop of the p-type column. The interval, between the fourth side of the second loop of the p-type column and the fourth side of the first loop of the p-type column is the interval d. The intervals a, b, c, and d have a size relation of d>c>b>a.

In this manner, by designating the corner of each loop of p-type column as the starting point, the interval between the corresponding sides of each loop of the p-type column may be changed. By varying the p-type column intervals (pitches) in this manner, the withstand voltage can be adjusted in a balanced manner with respect to each location in the peripheral region PER, and the withstand voltage of the cell region CR and the peripheral region PER can be adjusted in a balanced manner.

The fifth application example is described as the example in which the p-type column intervals (pitches a to h) are widened in order (a<b<c<d<e<f<g<h); however, the size relation of the p-type column intervals may be determined to be, for example, a=b<c=d<e=f<g=h or a>b>c>d>e>f>g>h.

Obviously, the fifth application example achieves the same effect achieved by the first embodiment.

The semiconductor device of the fifth application example can be manufactured by the same manufacturing processes as carried out in the first embodiment, using the reticle whose pattern used for forming the trenches DT3 is changed to the pattern corresponding to the shape of the p-type column regions.

Sixth Application Example

In a sixth application example, the shape of the field plate electrode FFP will be described. FIGS. 28 to 31 are plan views or sectional views for explaining a configuration of a semiconductor device according to the sixth application example of the second embodiment. According to the first embodiment, the field plate electrode FFP is arranged above the boundary between the p-type column region PC3 and the n-type column region NC3. That is, as shown in FIG. 28, the field plate electrode FFP is arranged above the end of the p-type column region PC3 that is opposite to the cell region CR. In this case, the field plate electrode FFP is spirally arranged as in the p-type column region PC3.

Figure 29:
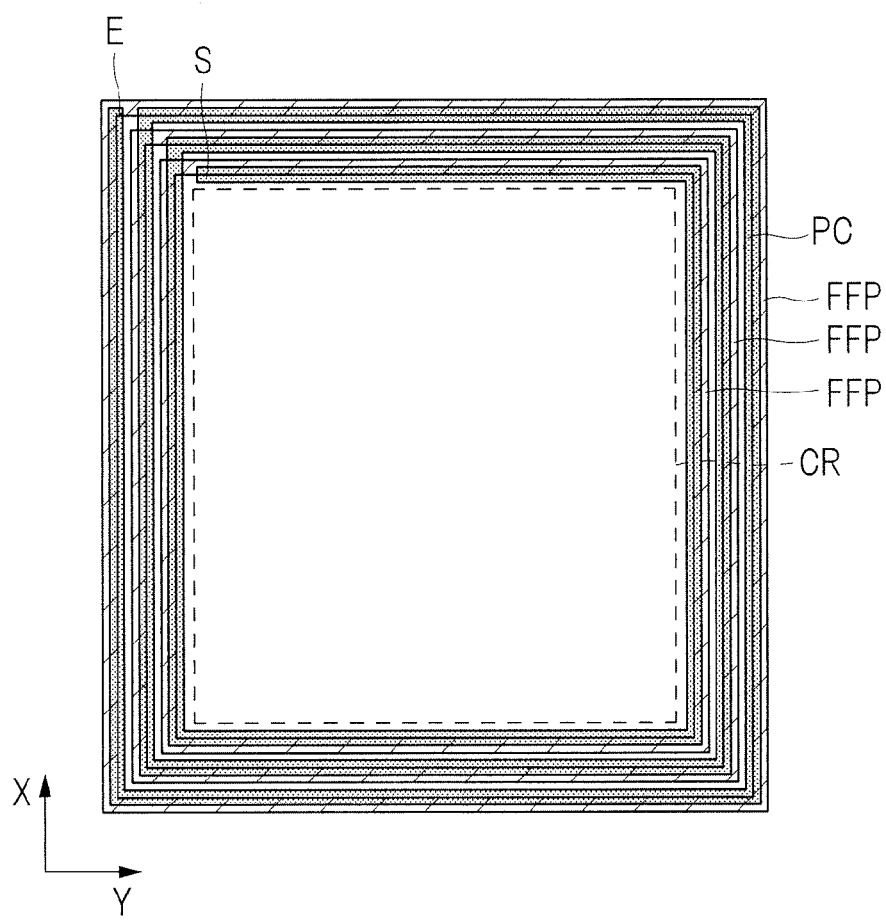
FIG. 29 is a plan view for explaining the configuration of the semiconductor device according to the sixth application example of the second embodiment.

In FIG. 29, the field plate electrode FFP is arranged along the end of p-type column region PC3 that is opposite to the cell region CR side, and is connected at the corner (starting point) of each loop of the p-type column on a loop to loop basis to form a loop structure. In this manner, the field plate electrodes FFP may be multiply-formed.

Figure 30A:
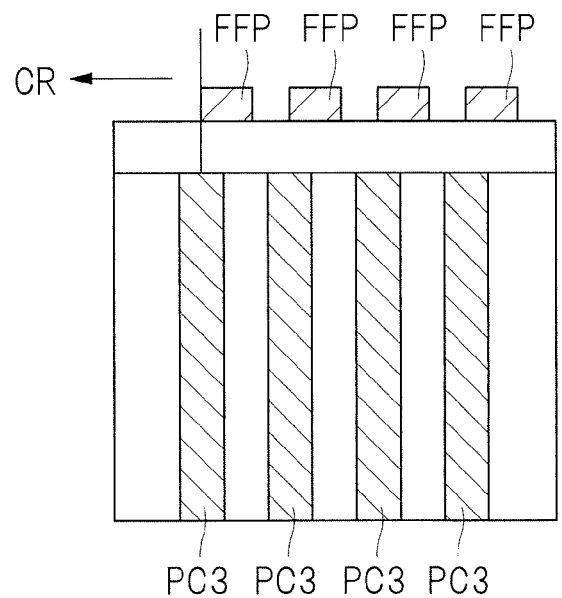
FIGS. 30A and 30B are sectional views for explaining the configuration of the semiconductor device according to the sixth application example of the second embodiment.

According to the first embodiment, as shown in FIG. 30A, the field plate electrode FFP is arranged above the end of the p-type column region PC3 that is opposite to the cell region CR side (see also FIG. 2).

Figure 30B:
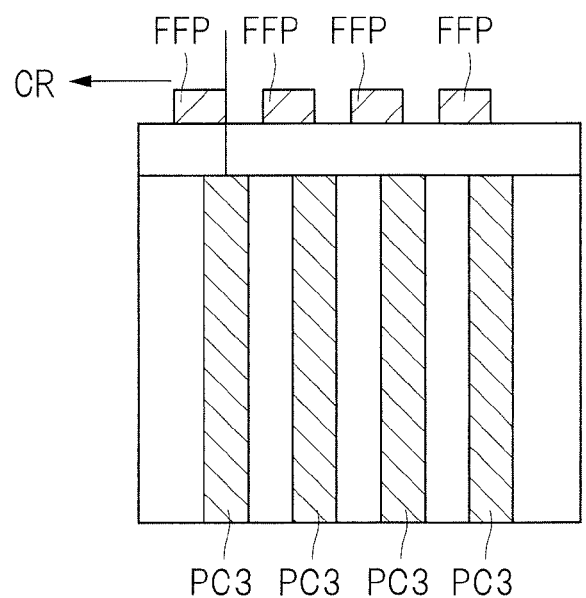

In contrast, as shown in FIG. 30B, the field plate electrode FFP may be arranged above the end of the p-type column region PC3 in the cell region CR side.

Figure 31:
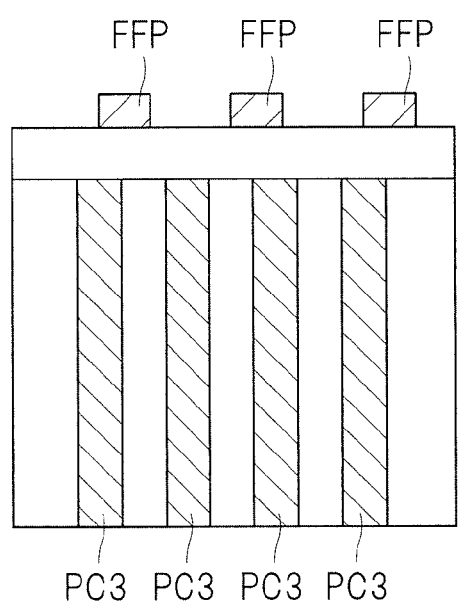
FIG. 31 is a sectional view for explaining a configuration of the semiconductor device according to the sixth application example of the second embodiment.

As shown in FIG. 31, the location of the field plate electrode FFP may be changed with respect to each loop of the p-type column. For example, the field plate electrode FFP may be arranged above the end of m-th loop of p-type column that is opposite to the cell region CR side, and the field plate electrode FFP may be arranged above the end of (m+2)-th loop of the p-type column in the cell region CR side. The field plate electrode FFP does not need to be always arranged above each loop of the p-type column, but may be arranged above every other loop of the p-type column.

The invention made by the inventor has been described above based on the embodiments. The present invention is not limited to the above embodiments but may obviously be modified into various forms of applications on the condition that the modification does not deviate from the substance of the invention.

For example, each configuration of the first to fifth application examples may be optionally combined and applied to the first embodiment. For example, as for the configuration of the third application example in which the dummy p-type column region DC is provided and the configuration of the fourth application example in which the interval between the p-type columns is changed with respect to each loop, these configurations may be combined together to apply the combined configuration to the first embodiment.

What is claimed is:

1. A semiconductor device comprising:
    a semiconductor layer having a first region and a second region surrounding the first region;
    a plurality of first pillars of a first conductive type and a plurality of second pillars of a second conductive type reversed in conductivity to the first conductive type, the first and second pillars being formed in the semiconductor layer in the first region;
    a semiconductor element formed above the semiconductor layer in the first region; and
    a third pillar of the first conductive type and a fourth pillar of the second conductive type, the third and fourth pillars being formed in the semiconductor layer in the second region,
    wherein the first pillars and the second pillars are arranged alternately,
    the third pillar is arranged such that it spirally surrounds the first region,
    the fourth pillar is arranged between the spiral third pillars, the fourth pillar being arranged such that it spirally surrounds the first region,
    the first pillar is arranged in a first trench formed in the semiconductor layer,
    the third pillar is arranged in a second trench formed in the semiconductor layer, and
    a first loop of the spiral third pillar has a corner, and a first side face and a second side face that make up the corner correspond to a (100) plane or a (110) plane.

2. The semiconductor device according to claim 1,
    wherein the third and fourth pillars rectangularly and spirally surround the first region that is rectangular when seen in a plan view, at least two or more times as a rectangular loop,
    a first loop is arranged along respective sides of the rectangular first region, and
    a second loop is arranged along respective sides of the first loop.

3. The semiconductor device according to claim 2,
    wherein a starting point of the third pillar is located at a corner of the rectangular first region.

4. The semiconductor device according to claim 2,
    wherein a starting point of the third pillar is located at a halfway point of a first side of the rectangular first region.

5. The semiconductor device according to claim 4, comprising a fifth pillar located between a corner of the rectangular first region and a starting point of the third pillar.

6. The semiconductor device according to claim 1,
    wherein the third and fourth pillars rectangularly and spirally surround the first region that is rectangular when seen in a plan view, at least three or more times as a rectangular loop,
    a first loop is arranged along respective sides of the rectangular first region,
    a second loop is arranged along respective sides of the first loop,
    a third loop is arranged along respective sides of the second loop, and
    an interval between the first loop and the second loop is different from an interval between the second loop and the third loop.

7. The semiconductor device according to claim 6,
    wherein an interval between the first loop and the second loop is smaller than an interval between the second loop and the third loop.

8. The semiconductor device according to claim 1,
    wherein the third and fourth pillars rectangularly and spirally surround the first region that is rectangular when seen in a plan view, at least two or more times as a rectangular loop,
    a first loop is arranged along respective sides of the rectangular first region,
    a second loop is arranged along respective sides of the first loop, and an interval between a first side of the first loop and a first side of the second loop is different from an interval between a second side of the first loop and a second side of the second loop.

9. The semiconductor device according to claim 8, wherein an interval between a first side of the first loop and a first side of the second loop is smaller than an interval between a second side of the first loop and a second side of the second loop.

10. The semiconductor device according to claim 1, wherein the second trench has an aspect ratio of 12 or larger, the aspect ratio being given by dividing a depth of the second trench by a width of the same.

11. The semiconductor device according to claim 1, wherein the first trench has an aspect ratio of 12 or larger, the aspect ratio being given by dividing a depth of the first trench by a width of the same, and the second trench has an aspect ratio of 12 or larger, the aspect ratio being given by dividing a depth of the second trench by a width of the same.

12. The semiconductor device according to claim 1, comprising an electrode formed on the semiconductor layer in the second region.

13. The semiconductor device according to claim 12, wherein the electrode is spirally arranged along the spiral third pillar.

14. The semiconductor device according to claim 12, wherein the electrode is arranged along the spiral third pillar, in a looped manner.

15. The semiconductor device according to claim 1, wherein the semiconductor element includes:
a gate electrode formed on the second pillar via a gate insulating film;
a semiconductor region of the first conductive type, the semiconductor region being formed in an upper part of the first pillar adjacent to the second pillar; and
a source region formed in an upper part of the semiconductor region.

16. A manufacturing method for a semiconductor device comprising:
(a) a step of forming a plurality of first trenches in a first region of a semiconductor layer of a first conductive type and forming a second trench in a second region surrounding the first region of the semiconductor layer, the second trench spirally surrounding the first region; and
(b) a step of filling the first and second trenches with a semiconductor of a second conductive type reversed in conductivity to the first conductive type, (b1) thereby forming a first pillar in the first trench and a second pillar made of the semiconductor layer between the first pillars, and (b2) thereby forming a third pillar in the second trench and a fourth pillar made of the semiconductor layer between the spiral third pillars,
wherein the step (a) is a process of forming the second trench having a corner made up of a first side face and a second side face, and
the step (b2) is a process of filling the second trench with the semiconductor by a crystal growth method.

17. The manufacturing method for the semiconductor device according to claim 16, wherein the first side face and the second side face correspond to a (100) plane or a (110) plane.

18. The manufacturing method for the semiconductor device according to claim 16, wherein the second trench rectangularly and spirally surrounds the first region that is rectangular when seen in a plan view, at least three or more times as a rectangular loop,
a first loop is arranged along respective sides of the rectangular first region,
a second loop is arranged along respective sides of the first loop, and
a third loop is arranged along respective sides of the second loop.

19. The manufacturing method for the semiconductor device according to claim 16, wherein the first trench has an aspect ratio of 12 or larger, the aspect ratio being given by dividing a depth of the first trench by a width of the same, and the second trench has an aspect ratio of 12 or larger, the aspect ratio being given by dividing a depth of the second trench by a width of the same.

20. The manufacturing method for the semiconductor device according to claim 16, comprising (c) a step of forming a semiconductor element in the first region after the step (b),
wherein the step (c) includes:
(c1) a step of forming a gate electrode on the second pillar via a gate insulating film;
(c2) a step of forming a semiconductor region of the first conductive type in the first pillar adjacent to the second pillar; and
(c3) a step of forming a source region in an upper part of the semiconductor region.

* * * * *